United States Patent
Sugimoto et al.

(10) Patent No.: US 7,068,555 B2
(45) Date of Patent: Jun. 27, 2006

(54) SEMICONDUCTOR MEMORY STORAGE DEVICE AND A REDUNDANCY CONTROL METHOD THEREFOR

(75) Inventors: Satoru Sugimoto, Kasugai (JP); Takaaki Furuyama, Kasugai (JP); Mitsuhiro Nagao, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/061,307

(22) Filed: Feb. 18, 2005

(65) Prior Publication Data

US 2005/0185482 A1 Aug. 25, 2005

Related U.S. Application Data

(63) Continuation of application No. PCT/JP2004/002030, filed on Feb. 20, 2004.

(51) Int. Cl.
*G11C 7/00* (2006.01)

(52) U.S. Cl. .................... 365/200; 365/189.09

(58) Field of Classification Search ............... 365/200, 365/189.09, 230.03, 185.29
See application file for complete search history.

(56) References Cited

U.S. PATENT DOCUMENTS

| | | |
|---|---|---|
| 6,397,313 B1 | 5/2002 | Kasa et al. |
| 6,418,051 B1 | 7/2002 | Manstretta et al. |
| 6,563,732 B1 | 5/2003 | Matarrese et al. |
| 6,594,177 B1 | 7/2003 | Matarrese et al. |
| 6,643,196 B1 | 11/2003 | Sugio |
| 6,711,074 B1 * | 3/2004 | Kwon .................... 365/200 |
| 2002/0001237 A1 | 1/2002 | Manstretta et al. |
| 2002/0012282 A1 | 1/2002 | Saito et al. |

FOREIGN PATENT DOCUMENTS

| | | |
|---|---|---|
| JP | 06-150670 | 5/1994 |
| JP | 06-163856 | 6/1994 |
| JP | 09-128962 | 5/1997 |
| JP | 2001-229691 | 8/2001 |
| JP | 2002-269994 | 9/2002 |
| JP | 2003-109389 | 4/2003 |

OTHER PUBLICATIONS

Toru Tanzawa, et al., 44-mm$^2$ Four-Bank Eight-Word Page-Read 64-Mb Flash Memory With Flexible Block Redundancy and Fast Accurate Word-Line Voltage Controller, IEEE Journal of Solid-State Circuits, vol., 37 No. 11, p., 1485-1492, Nov. 2002.

* cited by examiner

*Primary Examiner*—Son T. Dinh
(74) *Attorney, Agent, or Firm*—Ingrassia Fisher & Lorenz PC

(57) ABSTRACT

An address identifying memory block is match-compared with address information stored in a to-be-remedied block memory section in a block redundancy judge section. A redundant block select signal is outputted from the block redundancy judge section by judgment of address match. A memory block column select section selects a memory block column having a redundant memory block irrespective of an address signal as the redundant block select signal is activated if block redundancy is activated to output a memory block column select signal. A column redundancy memory section selects address information of column redundancy relating a redundant memory block arranged in a memory block column in accordance with the memory block column select signal.

15 Claims, 19 Drawing Sheets

$$V_{prog} = (1 + \frac{CL}{CU}) \cdot V_{ref}$$

FIG. 18   PRIOR ART

| PDEC | | |
|---|---|---|
| CELL ARRAY ACLA | WLDEC | CELL ARRAY ACLA |
| ABLDEC/ASLDEC | | ABLDEC/ASLDEC |
| CELL ARRAY ACLA | WLDEC | CELL ARRAY ACLA |
| CELL ARRAY ACLA | WLDEC | CELL ARRAY ACLA |
| ABLDEC/ASLDEC | | ABLDEC/ASLDEC |
| CELL ARRAY ACLA | WLDEC | CELL ARRAY ACLA |
| CELL ARRAY ACLA | WLDEC | CELL ARRAY ACLA |
| ABLDEC/ASLDEC | | ABLDEC/ASLDEC |
| CELL ARRAY ACLA | WLDEC | CELL ARRAY ACLA |
| CELL ARRAY ACLA | WLDEC | CELL ARRAY ACLA |
| ABLDEC/ASLDEC | | ABLDEC/ASLDEC |
| CELL ARRAY ACLA | WLDEC | CELL ARRAY ACLA |

 :REDUNDANCY SECTOR

SEMICONDUCTOR MEMORY STORAGE DEVICE AND A REDUNDANCY CONTROL METHOD THEREFOR

CROSS-REFERENCES TO RELATED APPLICATIONS

This is a continuation of International Application No. PCT/JP2004/002030, filed Feb. 20, 2004 which was not published in English under PCT Article 21(2).

FIELD OF THE INVENTION

The present invention relates to a semiconductor memory device having a redundancy control function for redundancy remedying an access-defective memory cell and a redundancy control method therefore. More specifically, the present invention relates to a redundancy control function which can cope with both area efficiency on a chip die and redundancy remedy efficiency and can apply suitable voltage bias.

BACKGROUND OF THE INVENTION

A redundancy region having a preliminary memory cell is provided, such that if a memory cell of a semiconductor memory device or a bit line connected to the memory cell is defective, a method for redundancy remedy accesses the memory cell in the redundancy region with a memory cell address to be accessed is known to those skilled in the art.

In a non-volatile memory device, for example, a redundancy remedy function may, in addition to a column redundancy function for conducting redundancy remedy by replacing a bit line connected to a plurality of memory cells as a redundancy unit with a redundancy bit line, may have a block redundancy function, when performing batch operation such as data erase by memory block having a predetermined number of memory cells, which enables redundancy remedy by replacing the memory block as a redundancy unit with a redundant memory block. Redundancy remedy efficiency using the redundant memory block in the semiconductor memory device has a trade-off relation to increased occupied area on a chip die. Redundant memory block arrangement constitution which has been proposed will be overviewed below.

In Patent Document 1 described below, as shown in FIG. 17, a memory architecture 110 has a matrix 111 of memory cells with n×m memory sectors. The memory sectors arranged in the matrix 111 consist of vertical sector groups indicated by V1, V2, . . . , Vn and horizontal sector groups indicated by H1, H2, . . . , Hm. Row redundancy sectors R1, R2, . . . , Rn are provided to the vertical sector groups V1, V2, . . . , Vn, respectively.

Row address ADr to be accessed is supplied to a row decoder 112 and a memory matrix 114 storing a defective row address by vertical sector group. When the row address ADr is matched with the defective row address, a select signal to a redundancy cell row is outputted from the matrix 114 to the row decoder 112 and a column decoder 113. A sector including the defective row address is replaced with a redundancy sector belonging to the vertical sector group including the sector. The replacement with the redundancy sector is conducted by the vertical sector group.

In Patent Document 2 described below, as shown in FIG. 18, word line decoder WLDEC, bit line decoder ABLDEC, and source line decoder ASLDEC are provided by 16 cell arrays ACLA. The cell array ACLA has 64 sectors and two redundancy sectors along a bit line. The two redundancy sectors are arranged at both ends of the cell array ACLA.

The replacement with a redundancy sector is conducted by replacing a defective column address with a redundancy column by the cell array ACLA. A sector including the defective column address is replaced with a redundancy sector belonging to the cell array ACLA including the sector. The replacement with a redundancy sector is conducted by the cell array ACLA.

In the IEEE Document described below, as shown in FIG. 19, in a flash memory in which a memory cell array region is partitioned into four banks and peripheral circuits are arranged in the center portion interposed between the banks, four redundancy sectors are added to one corner of the center portion in which the peripheral circuits are arranged. Each of the redundancy sectors can be replaced with a memory sector belonging to any bank.

The memory cells in the redundancy sector are connected to exclusive word lines and exclusive bit lines and are controlled by exclusive row decoders and exclusive column decoders.

The above-referenced prior art documents are as follows: Patent Document 1: Japanese Unexamined Patent Publication No. 2001-229691; Patent Document 2: Japanese Unexamined Patent Publication No. 2002-269994; and Non-Patent Document: IEEE J. of Solid-State Circuits, vol. 37, pp. 1485–1492, November 2002.

In the techniques described in the above Patent Documents 1 and 2, a redundancy sector is provided by the vertical sector group (Patent Document 1) or redundancy sectors are provided by the cell array ACLA (Patent Document 2). The number of remediable access-defective portions can be increased to contribute to the enhancement of the yield of a semiconductor memory device.

Generally, access defectiveness of a memory cell in a semiconductor memory device is not constant throughout the manufacturing period and is reduced through improvement in the manufacturing process and circuit function. A number of redundancy sectors which have been necessary in the early stage of manufacturing may be unnecessary by later improvements. A number of unused redundancy sectors will be left on a chip die, resulting in increased chip size. The increased chip size means a decreased number of effective chips per semiconductor wafer. In consideration of defectiveness remedy using the redundancy sector, a decreased number of effective chips due to provision of the redundancy sector by a small unit such as the vertical sector group can increase the manufacturing cost per chip.

In the above IEEE Document, the number of redundancy sectors is limited to improve the problem of increased chip size due to unused redundancy sectors.

In the IEEE Document, the redundancy sectors are arranged in the peripheral circuit region between banks, are connected to exclusive word lines and bit lines different from those connected to the memory sectors of the banks, and have exclusive row decoders and column decoders. When the column redundancy function is provided to the redundancy sectors, the word lines and bit lines are different from those of the memory sectors of the banks. Exclusive column redundancy judge circuits must be provided.

The occupied area on a chip die on which these exclusive connections and exclusive circuits are arranged can increase the chip size. In the same manner, the manufacturing cost per chip with a decreased number of effective chips per semiconductor wafer can be increased, which is a problem.

Thus, it is desirable to provide a semiconductor memory device which can improve redundancy remedy efficiency while reducing increased chip die area and can supply a suitable voltage bias to a redundant memory block irrespective of its arrangement position and a redundancy control method for the semiconductor memory device. The present invention has been made to solve at least one of the problems of the prior art.

BRIEF DESCRIPTION OF THE DRAWINGS

The present invention will hereinafter be described in conjunction with the following drawing figures, wherein like numerals denote like elements.

FIG. 18 is a conceptual diagram showing a redundancy sector constitution figuration of Patent Document 2.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention. Embodiments embodying a semiconductor memory device and a redundancy control method for the semiconductor memory device according to the present invention will be described below in detail with reference to the drawings based on FIGS. 1 to 16.

Figure 1:
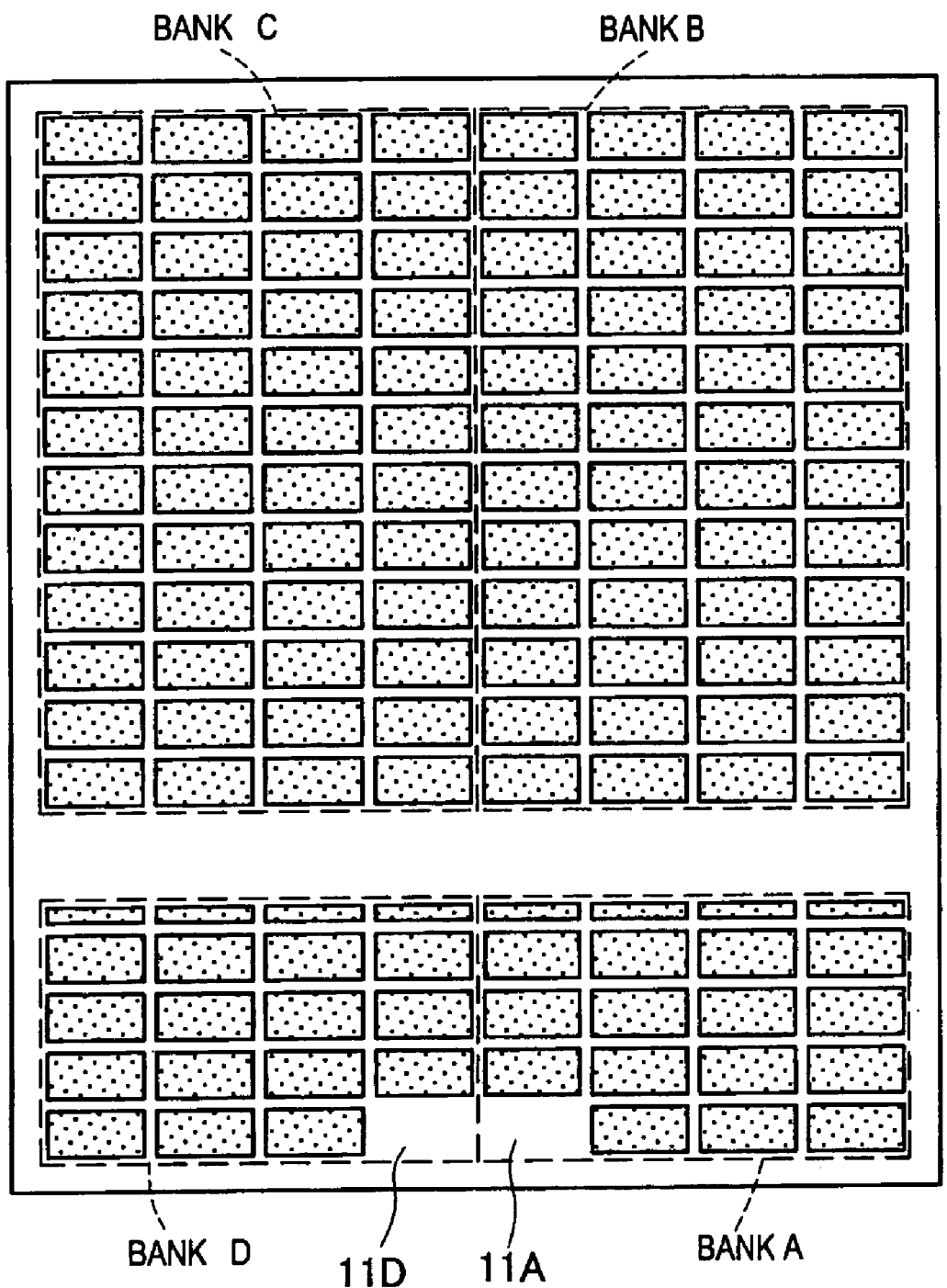
FIG. 1 is a layout schematic diagram illustrating a memory block arrangement in a semiconductor memory device.

FIG. 1 is an example showing a memory block structure for controlling a memory cell region by predetermined memory capacity in a semiconductor memory device such as a non-volatile memory device like a flash memory device.

In the flash memory, a unit of the memory block is generally the smallest unit of memory capacity conducting batch erase, the so-called sector unit. The memory blocks are arranged in a matrix in vertical and horizontal directions. In the following description, global bit lines are connected extending through the memory blocks in a vertical direction, and global word lines are connected in a horizontal direction. The memory blocks are arrayed in the vertical direction to form a memory block column. The vertical direction is called a row direction. The horizontal direction is called a column direction.

The memory cell region is divided into banks in which access control is conducted independently. There are various methods of dividing the memory cell region into the banks depending on the specifications. In FIG. 1, there are provided two large banks securing a large capacity (banks B and C) and two small banks having a relatively small capacity (banks A and D). A memory block having one sector capacity is assigned to each of the small banks (banks A and D) as a boot sector—a storage area of a starting program at system boot. In this case, the boot sector may be arranged in the head address in the bank from its specificity and the boot sectors may be dividedly arranged in the upper end of the bank. In the specific arrangement, the sections for one memory block are left in the banks A and D as regions 11A and 11D free from memory block(s).

Figure 2:
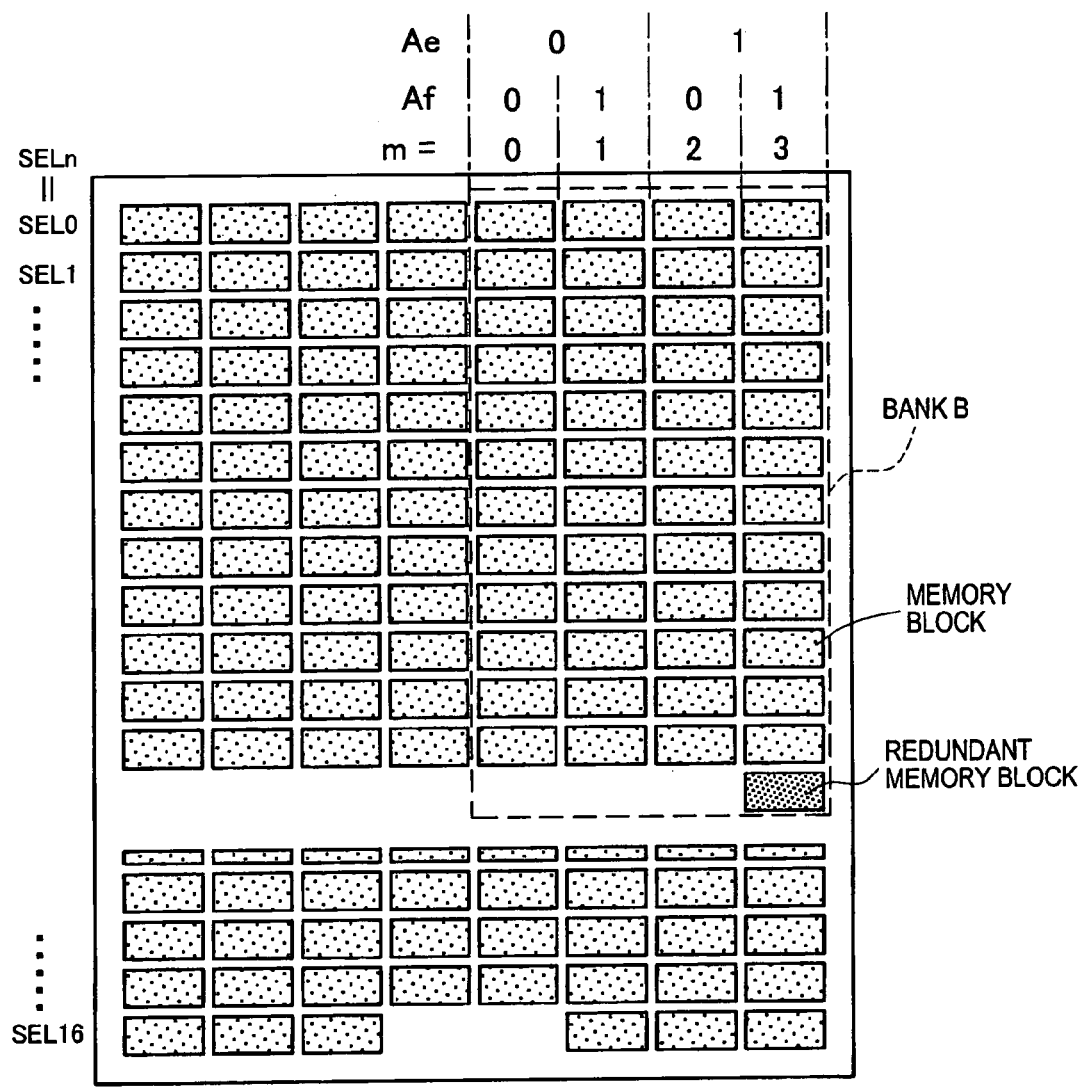
FIG. 2 is a layout schematic diagram illustrating a first redundant memory block arrangement when conducting a redundancy judge procedure according to a first embodiment.

FIG. 2 shows a first redundant memory block arrangement as an example of a redundant memory block arrangement when conducting a redundancy judge procedure according to a first embodiment to the semiconductor memory device having the bank construction of FIG. 1. In this embodiment, a redundant memory block is arranged at the lowest end of a predetermined memory block column. The redundant memory block is arranged in part of the peripheral circuit region between the large bank B and the small bank A to share a global bit line in the same column as a memory block column (m=3). An exclusive global bit line and decode circuit therefor are unnecessary. The occupied area on a chip die due to the redundant memory block arrangement can therefore be minimized.

The bank B will be described below. The bank C can have the same construction. The small banks (banks A and D) have the same construction.

Addresses identifying memory block columns are address signals Ae and Af. Four memory block columns arranged in the bank B and identified by m=0 to 3 in column direction from the left end to the right side in the drawing are selected by (Ae, Af)=(0, 0), (0, 1), (1, 0) and (1, 1). Addresses having a predetermined number of bits in predetermined bit positions, not shown, identify the column direction of memory block and are identified by memory block row identification signal SELn (n=0, 1, . . . ).

Figure 3:
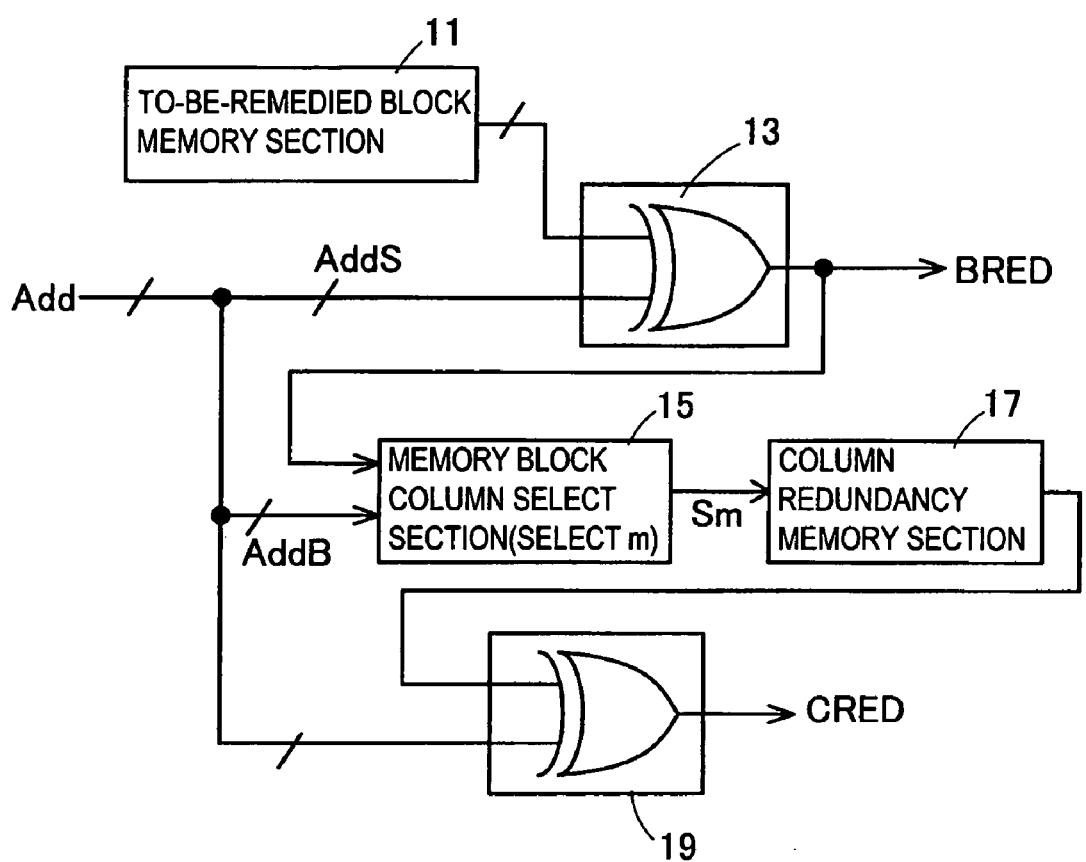
FIG. 3 is a diagram showing a procedure when conducting redundancy judge according to the first embodiment.

In the redundancy judge procedure according to the first embodiment shown in FIG. 3, the presence or absence of block redundancy is judged in accordance with inputted address signal Add. In applying block redundancy, column redundancy in a redundant memory block is judged.

If redundancy remedy is conducted with necessary redundant memory blocks in order that the yield is enhanced by improvement in the manufacturing process and circuit construction, the redundancy remedy may be conducted across a memory block column in accordance with a to-be-remedied block. In this case, a memory block column in which a redundant memory block is arranged must be identified to conduct column redundancy to the block column. Normal memory blocks arranged in a memory block column and a redundant memory block arranged in the same block column share a global bit line. When identifying a memory block column in accordance with later-described memory block column select signal Sm, column redundancy in the redundant memory block can be conducted by the same control as column redundancy for the normal memory blocks.

FIG. 3 will be described again. When inputting the address signal Add identifying a memory cell to be accessed, the match comparison of address AddS identifying a memory block with address information stored in a to-be-remedied block memory section 11 as a memory block to be redundancy remedied (to-be-remedied block) is conducted by a block redundancy judge section 13. When judging that the addresses are matched, redundant block select signal BRED is outputted from the block redundancy judge section 13. The redundant block select signal BRED is inputted to the redundancy part, not shown, controlling the access position to a redundant memory block and is inputted to a memory block column select section 15.

Address signal AddB identifying a memory block column of the address signals Add is inputted to the memory block column select section 15. When the redundant block select signal BRED is not activated, the memory block column select section 15 outputs the memory block column select signal Sm (m=0 to 3) selecting predetermined memory block column m (any one of m=0 to 3) in accordance with the address signal AddB. When the redundant block select signal BRED is activated, the memory block column select section 15 outputs the memory block column select signal Sm (m=0 to 3) selecting predetermined memory block column m (any one of m=0 to 3) in accordance with the redundant block select signal BRED irrespective of the address signal AddB. It is outputted to a later-stage column redundancy memory section 17.

The column redundancy memory section 17 selects stored address information relating to the memory block column to be accessed in accordance with the inputted memory block column select signal Sm. The match comparison of the address information with the inputted address signal is judged in a column redundancy judge section 19. When judging that the addresses are matched, the column redundancy judge section 19 outputs redundancy column select signal CRED. The redundancy column select signal CRED is inputted to the redundancy part, not shown, controlling column redundancy.

Figure 4:
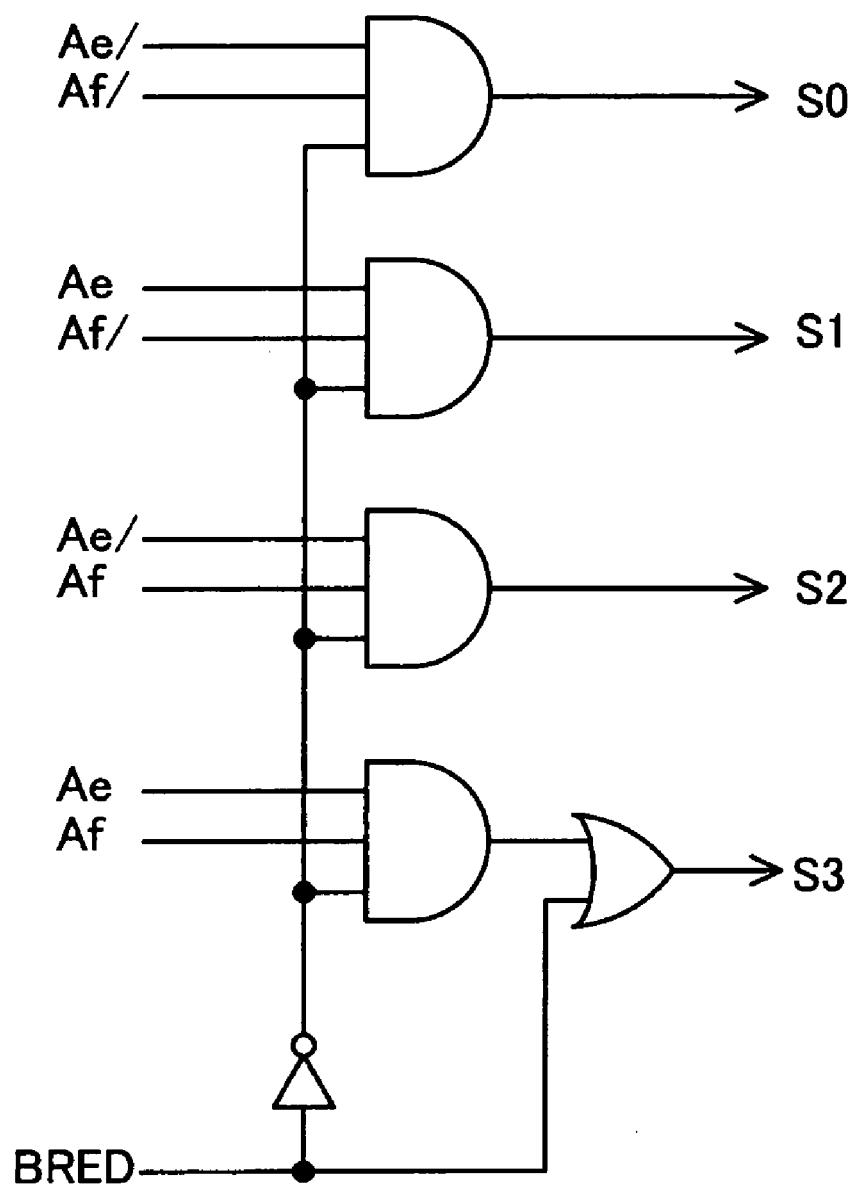
FIG. 4 is a diagram showing memory block column select means in accordance with the first redundant memory block arrangement.

FIG. 4 shows a specific constitution example of the memory block column select section 15 when conducting redundancy judge in the first redundant memory block arrangement (FIG. 2).

The logic combination of the address signals Ae and Af identifying a memory block column is inputted to an AND part with an inversion signal of the redundant block select signal BRED. In the AND part to which the address signals Ae and Af are inputted, its output signal is inputted to an OR part with the redundant block select signal BRED. Its output signal is memory block column select signal S3. In other logic combinations of the address signals Ae and Af (Ae/, Af/), (Ae, Af/), and (Ae/, Af), the output signals of the AND parts are memory block column select signals S0 to S2.

When the redundant block select signal BRED is inactivated (low level) and block redundancy is not conducted, the memory block column select signal (any one of S0 to S3) is activated (high level) in accordance with the logic combination of the address signals Ae and Af at the AND part. A memory block column in which a memory block to be accessed is arranged is selected.

When the redundant block select signal BRED is activated (high level) and block redundancy is conducted, the output signals of all the AND parts are inactivated (low level) irrespective of the logic combination of the address signals Ae and Af. Only the output signal of the OR part is activated in accordance with the redundant block select signal BRED to activate (high level) the memory block column select signal S3. When applying block redundancy to a memory block to be accessed, a memory block column (m=3) in which a redundant memory block is arranged is selected.

Instead of the lowest end of a memory block column, the same function and effect can be obtained when a redundant memory block is arranged at the highest end. In a memory block column in which a redundant memory block is arranged, the same function and effect can be obtained in any one of the positions of m=0 to 2 in addition to m=3. It can be arranged in a suitable position in accordance with the arrangement of the peripheral circuit such as a Y decoder and wiring. An arrangement minimizing the influence on the circuit arrangement in the peripheral region is also possible.

Figure 5:
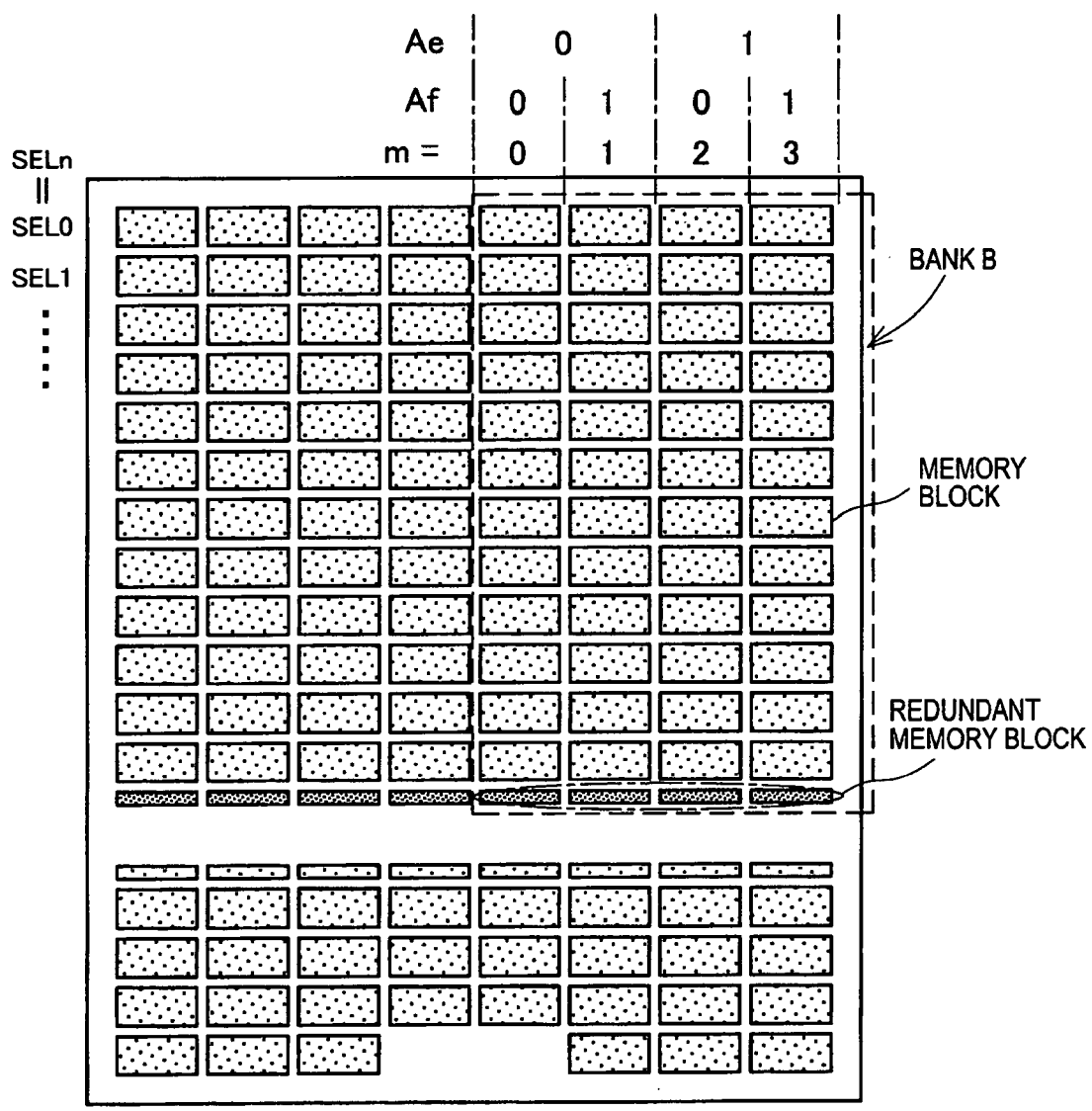
FIG. 5 is a layout schematic diagram illustrating a second redundant memory block arrangement when conducting a redundancy judge procedure according to the first embodiment.

FIG. 5 shows a second redundant memory block arrangement as an example of a redundant memory block arrangement when conducting a redundancy judge procedure according to the first embodiment to the semiconductor memory device having the bank construction of FIG. 1. In this embodiment, redundant memory blocks are divided such that they are arranged at the lowest ends of memory block columns. Redundancy memory sub-blocks are arranged at the lowest ends of the memory block columns (m=0 to 3) of the large bank B by sharing global bit line in the same memory block columns.

FIG. 5 shows the bank B. The bank C can have the same construction. The small banks (bands A and D) can have the same construction.

The redundancy memory sub-blocks are obtained by dividing the row direction of a redundant memory block by the number of memory block columns (four in this case). The four redundancy memory sub-blocks arranged in memory block columns constitute one redundant memory block.

Figure 6:
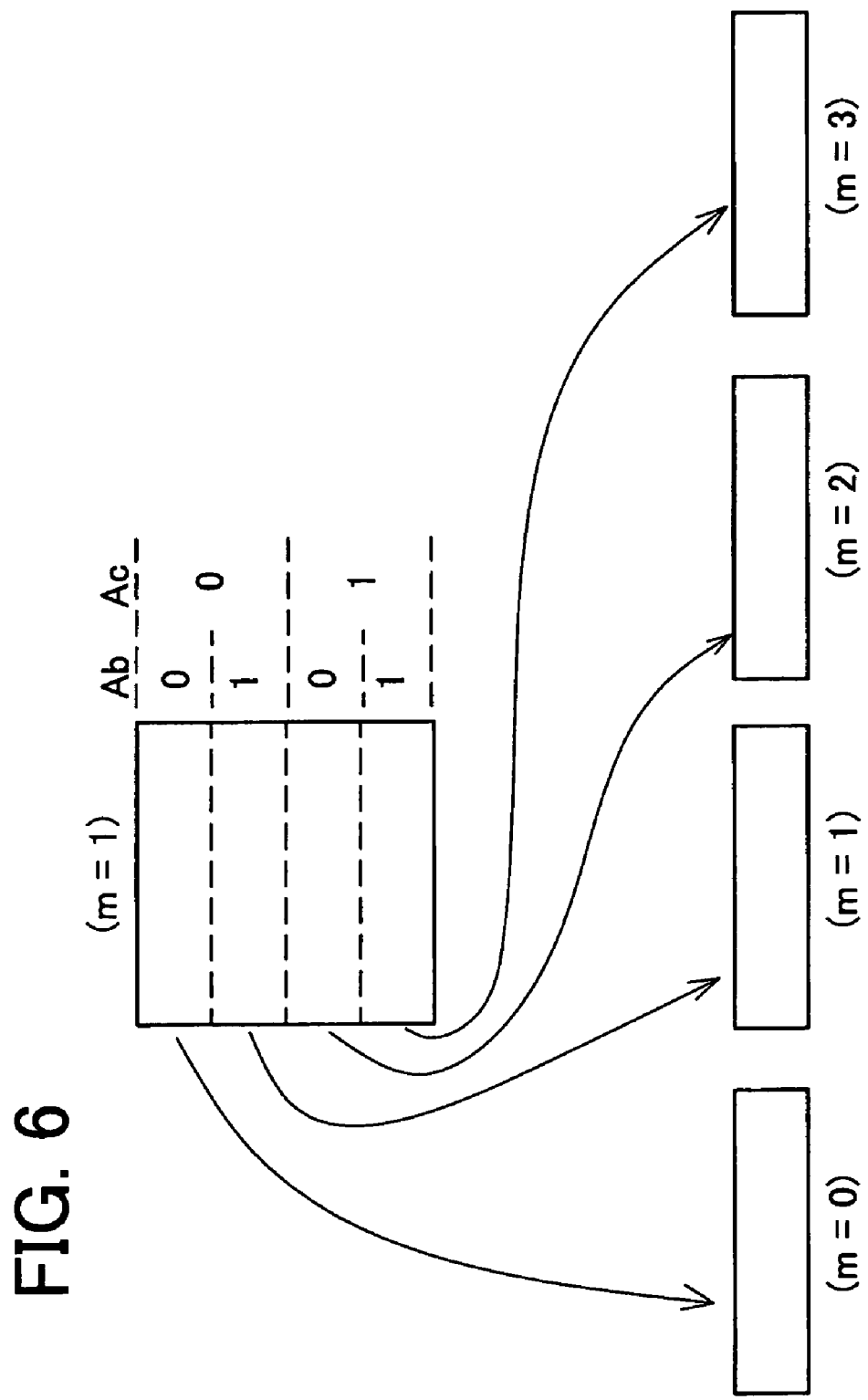
FIG. 6 is a conceptual diagram showing assignment from memory block to redundancy memory sub-block in the second redundant memory block arrangement.

FIG. 6 shows a specific conceptual diagram. Block redundancy is applied to the memory blocks arranged in the memory block column of m=1. In the same manner, when they are arranged in other memory block columns (m=0, 2 and 3), they are assigned to different redundancy memory sub-blocks in row direction identified in accordance with the logic combination of the address signals Ab and Ac. Specifically, dividedly, the memory cell region identified by (Ab, Ac)=(0, 0) is replaced with the redundancy memory sub-block of the memory block column of m=0; the memory cell region identified by (Ab, Ac)=(1, 0) is replaced with the redundancy memory sub-block of the memory block column of m=1; the memory cell region identified by (Ab, Ac)=(0, 1) is replaced with the redundancy memory sub-block of the memory block column of m=2; and the memory cell region identified by (Ab, Ac)=(1, 1) is replaced with the redundancy memory sub-block of the memory block column of m=3. If block redundancy is conducted, any one of the redundancy memory sub-blocks dividedly arranged in the memory block columns is selected in accordance with the access position in a row direction in a to-be-remedied block.

No exclusive global bit line and decode circuit therefore are necessary for redundant memory blocks, specifically, redundancy memory sub-blocks dividedly arranged in memory block columns. The redundancy memory sub-blocks are uniformly arranged in columns. There is no unevenness on a layout between the memory block columns. No wasteful bypass for laying connections occurs and circuits can be efficiently designed because the occupied area on a chip die due to the redundant memory block arrangement can be minimized.

Figure 7:
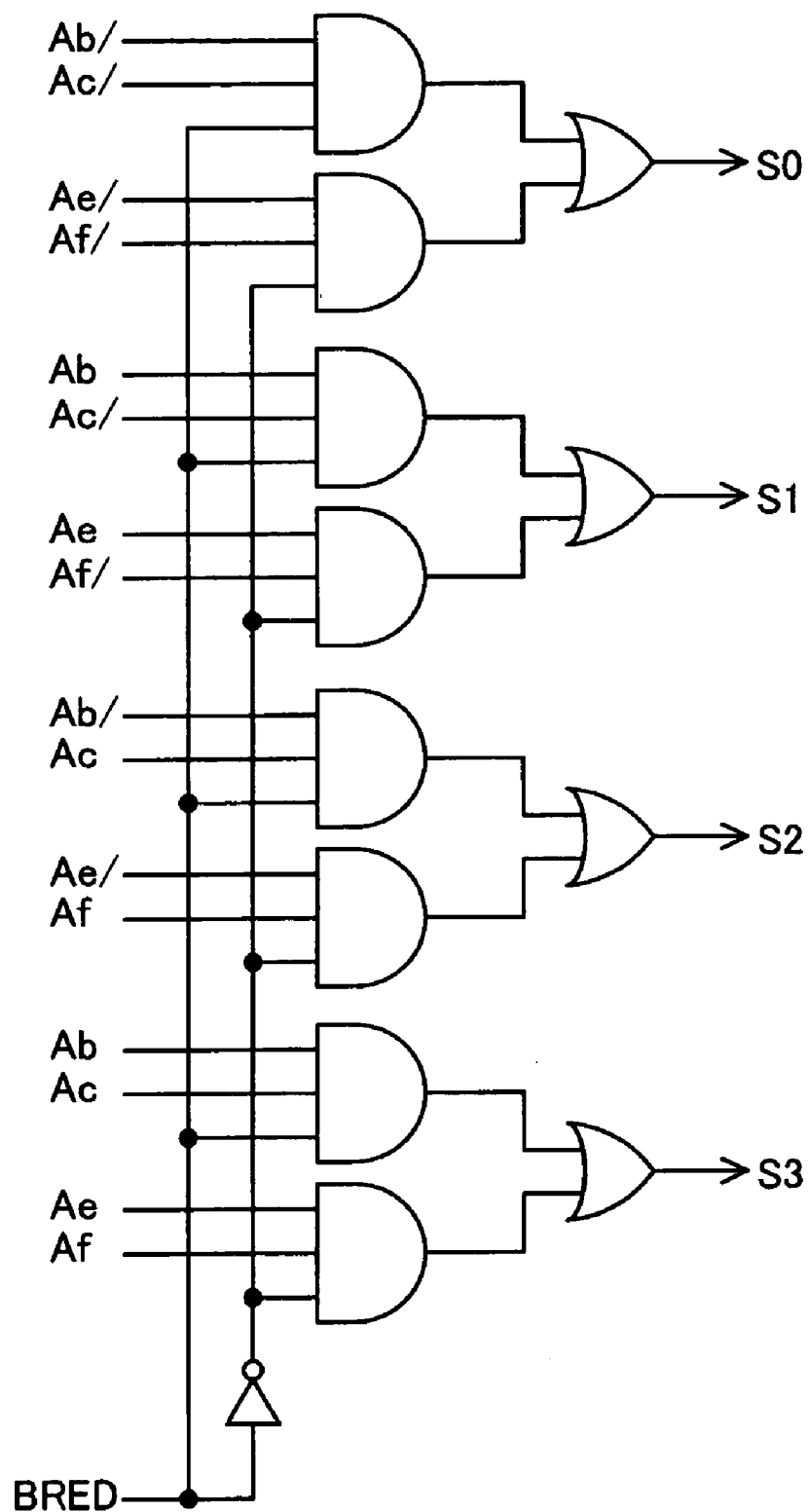
FIG. 7 is a diagram showing memory block column select means in accordance with the second redundant memory block arrangement.

FIG. 7 shows a specific design of the memory block column select section 15 (FIG. 3) conducting redundancy judge in the second redundant memory block arrangement (FIG. 5).

The memory block column select signals S0 to S3 are obtained as the OR computation result of the output signals of two AND parts. The logic combination of the address signals Ab and Ac dividing the row direction in a memory block into four is inputted to one of the AND parts with the redundant block select signal BRED. The logic combination of the address signals Ae and Af identifying a memory block column is inputted to the other AND part with the inversion signal of the redundant block select signal BRED.

When the redundant block select signal BRED is inactivated (low level) and block redundancy is not conducted, a low level signal is outputted from one of the AND parts irrespective of the address signals Ab and Ac. Any one of the AND parts is activated (high level) in accordance with the logic combination of the address signals Ae and Af in the other AND part. Any one of the memory block column select signals (any one of S0 and S3) in accordance with the logic combination of the address signals Ae and Af is activated (high level) through the OR part. A memory block column in which a memory block to be accessed is arranged is selected.

When the redundant block select signal BRED is activated (high level) and block redundancy is conducted, a low level signal is outputted from the other AND part irrespective of the logic combination of the address signals Ae and Af. Any one of the AND parts is activated (high level) in accordance with the logic combination of the address signals Ab and Ac in one of the AND parts. Any one of the memory block column select signals (any one of S0 and S3) in accordance with the address signals Ab and Ac is activated (high level) through the OR part. When applying block redundancy to a memory block to be accessed, a memory block column in which a redundancy memory sub-block to be accessed and selected in accordance with the row direction position in the memory block arrangement is selected.

Figure 8:
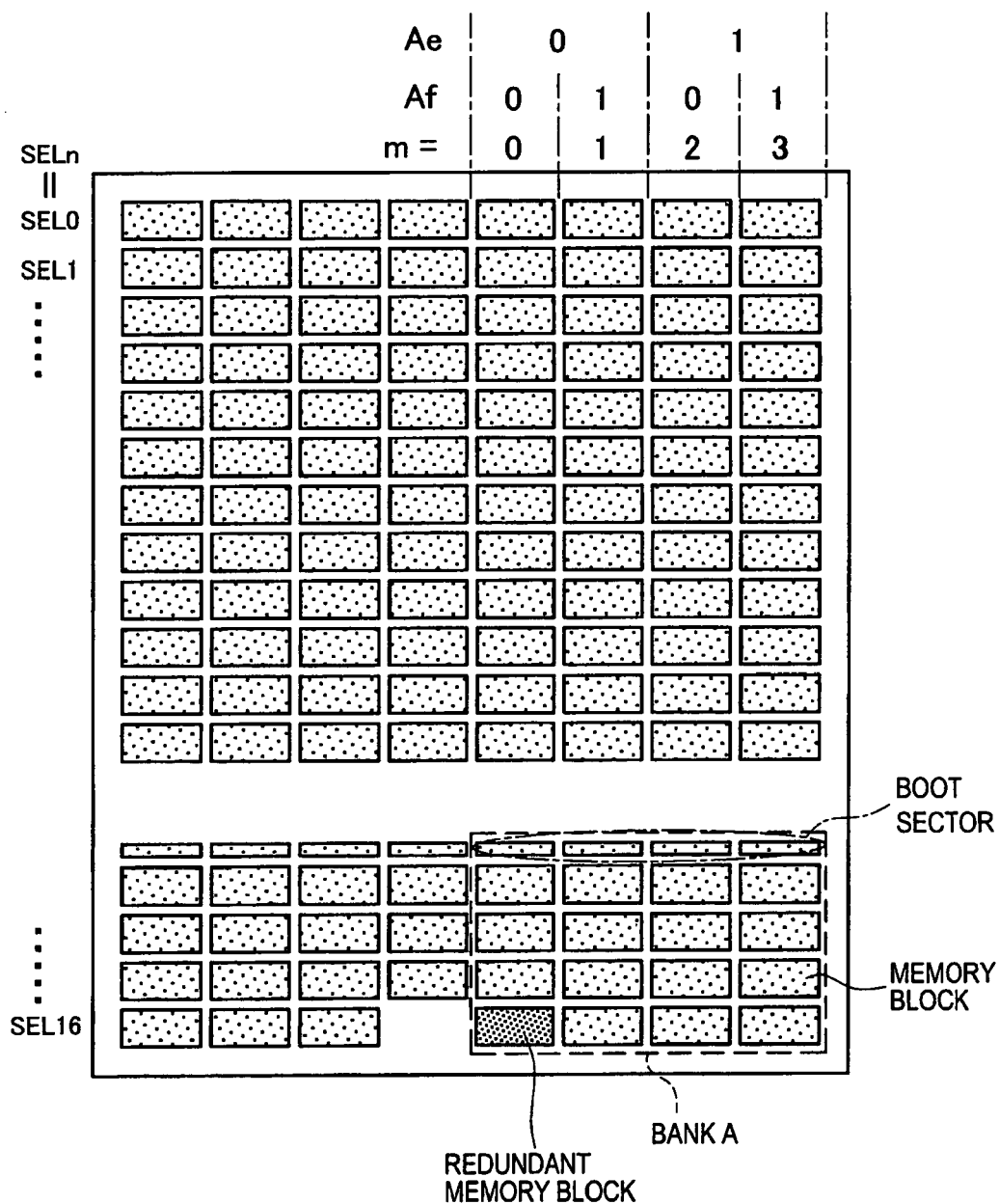
FIG. 8 is a layout schematic diagram illustrating a third redundant memory block arrangement when conducting a redundancy judge procedure according to the first embodiment.

FIG. 8 shows a third redundant memory block arrangement as an example of a redundant memory block arrangement when conducting a redundancy judge procedure according to the first embodiment of the semiconductor memory device having the bank constitution of FIG. 1. It will be described here taking an arrangement in the small banks (banks A and D) as an example. In this embodiment, a redundant memory block is arranged on a region free from memory block(s) in a memory clock column.

The bank A will be described below. The bank D can have the same construction. The large banks (banks B and C) can have the same construction when a region free from memory block(s) exists.

In the bank A, memory blocks with head addresses are boot sectors and are dividedly arranged in the highest position of the bank by memory block column, and an open region for one block occurs in the lowest position. In FIG. 8, there exists a region free from memory block(s) in the memory block column of m=0, in a memory block column indicated by SEL16. A redundant memory block is arranged in the region free from memory block(s).

The memory block column select section 15 (FIG. 3) when conducting redundancy judge in the third redundant memory block arrangement (FIG. 8) has the same construction as the example (FIG. 4) of the memory block column select section 15 when conducting redundancy judge in the first redundant memory block arrangement (FIG. 2).

In the third redundant memory block arrangement, the OR part of FIG. 4 may be provided in the position of the memory block column select signal S0 instead of the position of the memory block column select signal S3.

When the redundant block select signal BRED is inactivated (low level) and block redundancy is not conducted, the memory block column select signal (any one of S0 and S3) in accordance with the logic combination of the address signals Ae and Af of the AND part is activated (high level). A memory block column in which a memory block to be accessed is arranged is selected.

When the redundant block select signal BRED is activated (high level) and block redundancy is conducted, the output signals of all the AND parts are inactivated (low level) irrespective of the logic combination of the address signals Ae and Af. Only the output signal of the OR part is activated in accordance with the redundant block select signal BRED. The memory block column select signal S0 is activated (high level). When applying block redundancy to a memory block to be accessed, a memory block column in which a redundant memory block is arranged is selected.

Figure 9:
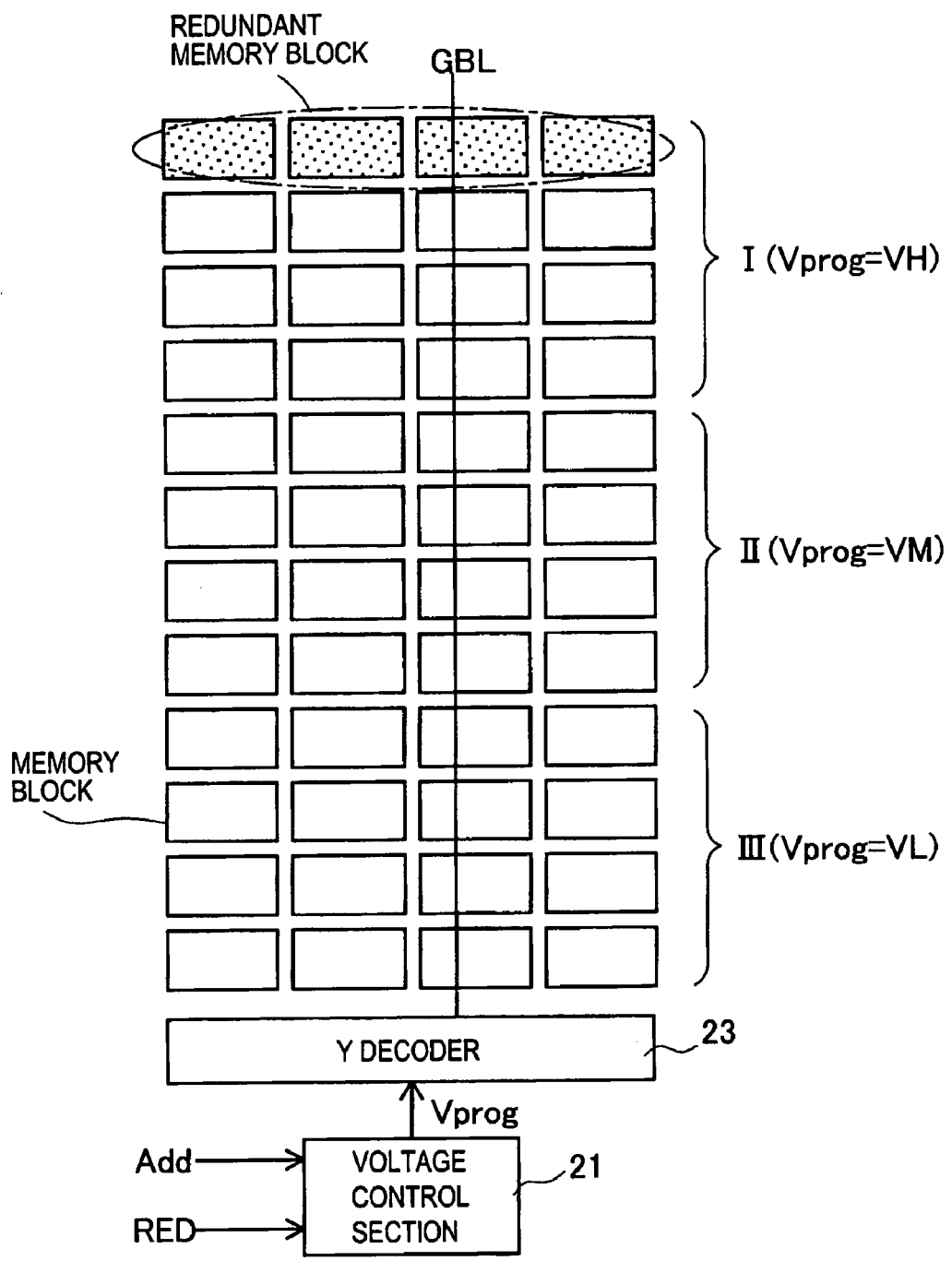
FIG. 9 is a layout schematic diagram illustrating a fourth redundant memory block arrangement when conducting bias voltage supply according to a second embodiment.

Referring to FIG. 9, the bias voltage supply to bit line according to a second embodiment will be described. When memory cells constituting memory blocks and redundant memory blocks are electrically rewritable non-volatile memory cells, in writing of memory information by a program, there is a method of injecting electrons to a floating gate by hot electrons. The injection method is conducted by flowing relatively large electric current from a bit line through the memory cells to a source line. The voltage difference between the terminals of the memory cells in the injection method must be higher than the voltage difference in normal read operation. Generally, a large electric current is flowed while applying large voltage to the gates of the memory cells to produce hot electrons for injecting the electrons to the floating gate.

The bias voltage supply to the bit line is conducted by a voltage control section 21 in which bias voltage Vprog is adjusted in accordance with the address signal Add in redundancy processing at which redundancy signal RED is activated. Electric charges are supplied through global bit line GBL selected by a Y decoder 23. Finite wiring resistance exists in the global bit line GBL to cause a voltage drop with electric current. To secure a desired voltage level at the terminals of a memory cell, it is important to adjust the bias voltage Vprog in accordance with length of the bit line from the voltage control section 21 through the Y decoder 23 to the memory cell.

In the fourth redundant memory block arrangement shown in FIG. 9, the adjustment of bias voltage is made in accordance with the arrangement position of a memory block including a redundant memory block. When applying bias to the memory cells of the group of a memory block belonging to the far distance from the voltage control section 21 (group I), the bias voltage Vprog is at a high voltage level (Vprog=VH). When applying bias to the memory cells of the group of a memory block belonging to the near distance from the voltage control section 21 (group III), the bias voltage Vprog is at low voltage level (Vprog=VL) (VL<VH). When applying bias to the memory cells of the group of a memory block belonging to the middle distance between the groups I and III (group II), the bias voltage Vprog is at a middle voltage level (Vprog=VM) (VL<VM<VH).

Figure 10:
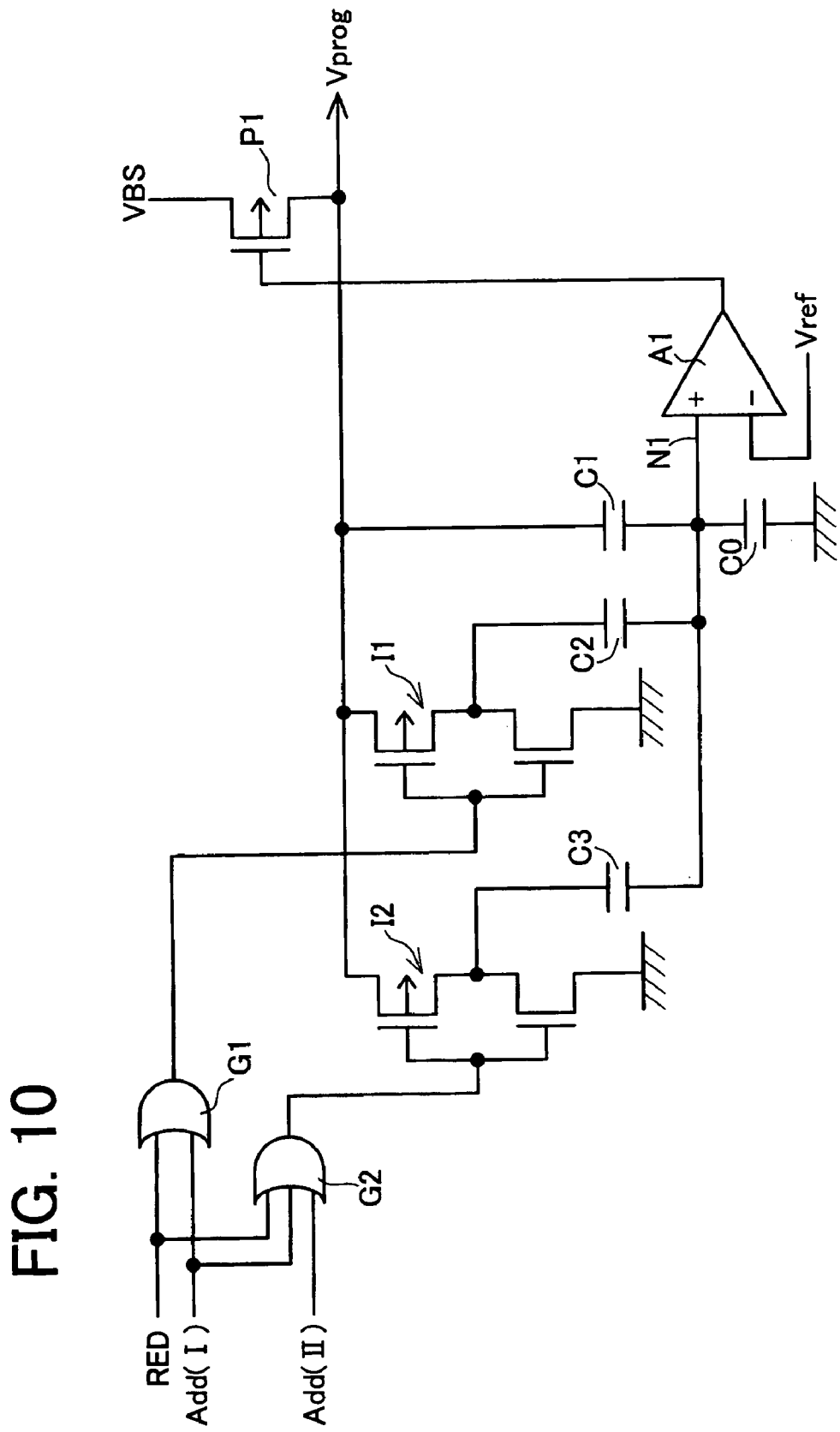
FIG. 10 is a diagram showing a bias voltage supply section in accordance with the fourth redundant memory block arrangement.

In FIG. 9, the redundant memory blocks are arranged in the farthest point from the voltage control section 21 and belong to the group I. FIG. 10 shows a circuit constitution example which adjusts bias voltage in accordance with an address indicating the arrangement position of a memory block and adjusts bias voltage in access to redundant memory blocks.

The bias voltage supply section in accordance with the fourth redundant memory block arrangement shown in FIG. 10 has an amplifier A1 to which reference voltage Vref is inputted to the negative side input terminal and PMOS transistor P1 whose gate terminal is driven by the amplifier A1 to adjust the voltage value of the bias voltage Vprog. In the PMOS transistor P1, voltage VBS is supplied to the source terminal and the bias voltage Vprog is outputted from the drain terminal in accordance with the controlled voltage to the gate terminal.

A positive side input terminal N1 of the amplifier A1 is connected to the bias voltage Vprog and the ground voltage via capacitance devices C1 and C0. The positive side input terminal N1 is further connected to one terminal of capacitance device C2 and one terminal of capacitance device C3. The other terminal of the capacitance device C2 and the other terminal of the capacitance device C3 are connected to the output terminals of inverter circuits I1 and I2 in which the positive side voltage level is the bias voltage Vprog and the negative side voltage level is the ground voltage. The input terminal of the inverter circuit I1 is controlled by OR circuit G1 to which the redundancy signal RED and the address signal Add(I) indicating that a memory block arranged in the group I is selected are inputted. The input terminal of the inverter circuit I2 is controlled by an OR circuit G2 to which the redundancy signal RED and the address signals Add(I) and Add(II) indicating that memory blocks arranged in the groups I and II are selected are inputted.

In the inverter circuits I1 and I2, the PMOS/NMOS transistors are exclusively conducted to connect the other terminal of the capacitance device C2 and the other terminal of the capacitance device C3 to the bias voltage Vprog or the ground voltage.

Figure 11:
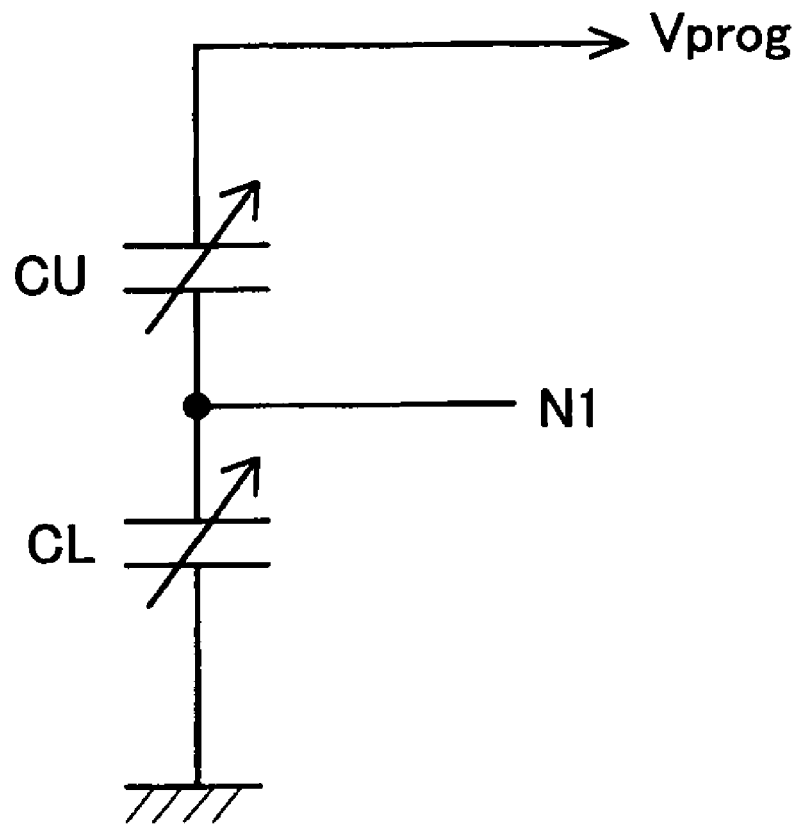
FIG. 11 is a diagram showing the setting of voltage division ratio by a voltage set section in the bias voltage supply section.

The voltage adjustment of the bias voltage Vprog is made by capacitance devices CU and CL connected in series as shown in FIG. 11. The junction of the capacitance devices CU and CL is node N1. The voltage level of the node N1 is adjusted by the amplifier A1 to be substantially equal to the reference voltage Vref. The bias voltage Vprog is adjusted to a desired voltage value in accordance with a voltage proportional division equation (Vprog=(1+CL/CU)×Vref) of the capacitance devices. The other terminal of the capacitance device C2 and the other terminal of the capacitance device C3 are connected to any one of the bias voltage Vprog and the ground voltage in accordance with the redundancy signal RED and the address signals Add(I) and Add(II). They are constituted as the capacitance device CU or as the capacitance device CL. The voltage value of the bias voltage Vprog can be variably adjusted as needed.

Specifically, when the memory block of the group I is selected (Add(I)=Hi, Add(II)=Lo) if redundancy processing is not conducted (RED=Lo) or if redundancy processing is conducted (RED=Hi), the output signals of the OR circuits G1 and G2 are both at high level. In the inverter circuits I1 and I2, the NMOS transistors are conducted to connect the other terminal of the capacitance device C2 and the other terminal of the capacitance device C3 to the ground voltage. The capacitance devices C2 and C3 are added to the capacitance device C0 so that the capacitance device CL=C0+C2+C3 and the capacitance device CU=C1. The bias voltage Vprog is $$Vprog=(1+(C0+C2+C3)/C1)\times Vref \quad (1)$$

When the memory block of the group II is selected (Add(I)=Lo, Add(II)=Hi) if redundancy processing is not conducted (RED=Lo), the output signal of the OR circuit G1 is at low level and the output signal of the OR circuit G2 is at high level. In the inverter circuits I1 and I2, the PMOS/NMOS transistors are conducted to connect the other terminals of the capacitance device C2 and the capacitance device C3 to the bias voltage Vprog and the ground voltage, respectively. The capacitance device C2 is added to the capacitance device C1 and the capacitance device C3 is added to the capacitance device C0 so that the capacitance device CL=C0+C3 and the capacitance device CU=C1+C2. The bias voltage Vprog is then $$Vprog=(1+(C0+C3)/(C1+C2))\times Vref \quad (2)$$

When the memory block of the group III is selected (Add(I)=Lo, Add(II)=Lo) if redundancy processing is not conducted (RED=Lo), the output signals of the OR circuits G1 and G2 are both at low level. In the inverter circuits I1 and I2, the PMOS transistors are conducted to connect the other terminal of the capacitance device C2 and the other terminal of the capacitance device C3 to the bias voltage Vprog. The capacitance devices C2 and C3 are added to the capacitance device C1 so that the capacitance device CL=C0 and the capacitance device CU=C1+C2+C3. The bias voltage Vprog is $$Vprog=(1+C0/(C1+C2+C3))\times Vref \quad (3)$$

In accordance with the position of a memory block selected by an address signal, and further in accordance with the position of a redundant memory block if redundancy remedy is conducted, the connection of the capacitance devices C2 and C3 is changed to adjust the voltage value of the bias voltage Vprog. In the fourth redundant memory block arrangement (FIG. 9) in which redundant memory blocks are at the farthest point from the voltage control section, when applying block redundancy, irrespective of an address signal, the highest voltage value shown by the equation (1) can be supplied as the bias voltage Vprog. The voltage value of the bias voltage Vprog if block redundancy is conducted is at a high voltage level. Enough bias voltage can then be applied to a redundant memory block.

Figure 12:
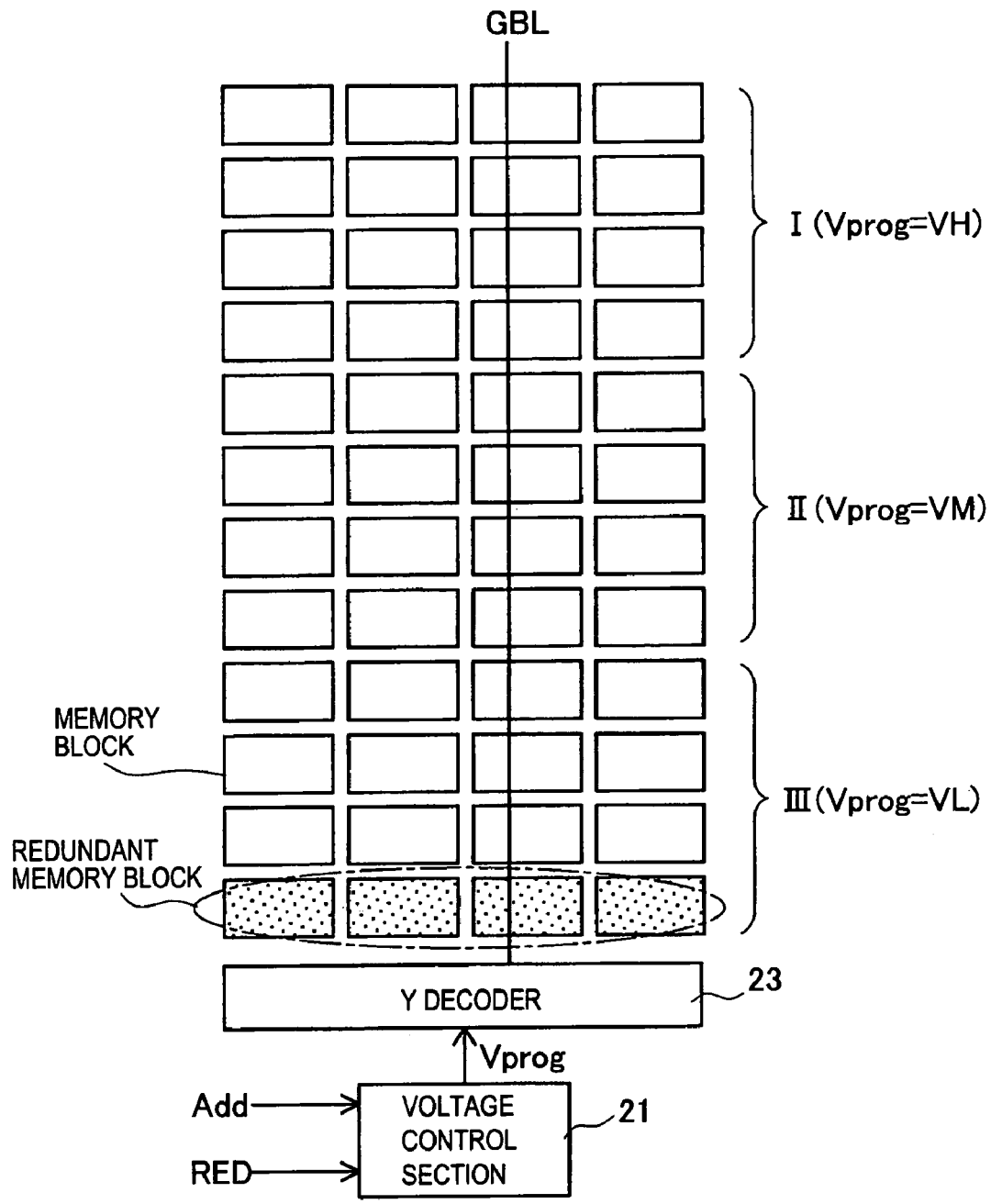
FIG. 12 is a layout schematic diagram illustrating a fifth redundant memory block arrangement when conducting bias voltage supply according to the second embodiment.

Although the redundant memory blocks are arranged in the farthest point from the voltage control section 21 in the fourth redundant memory block arrangement (FIG. 9), in a fifth redundant memory block arrangement shown in FIG. 12, the redundant memory blocks are arranged in the nearest point therefrom. The redundant memory blocks belong to the group of the memory blocks belonging to the near distance from the voltage control section 21 (group III).

Figure 13:
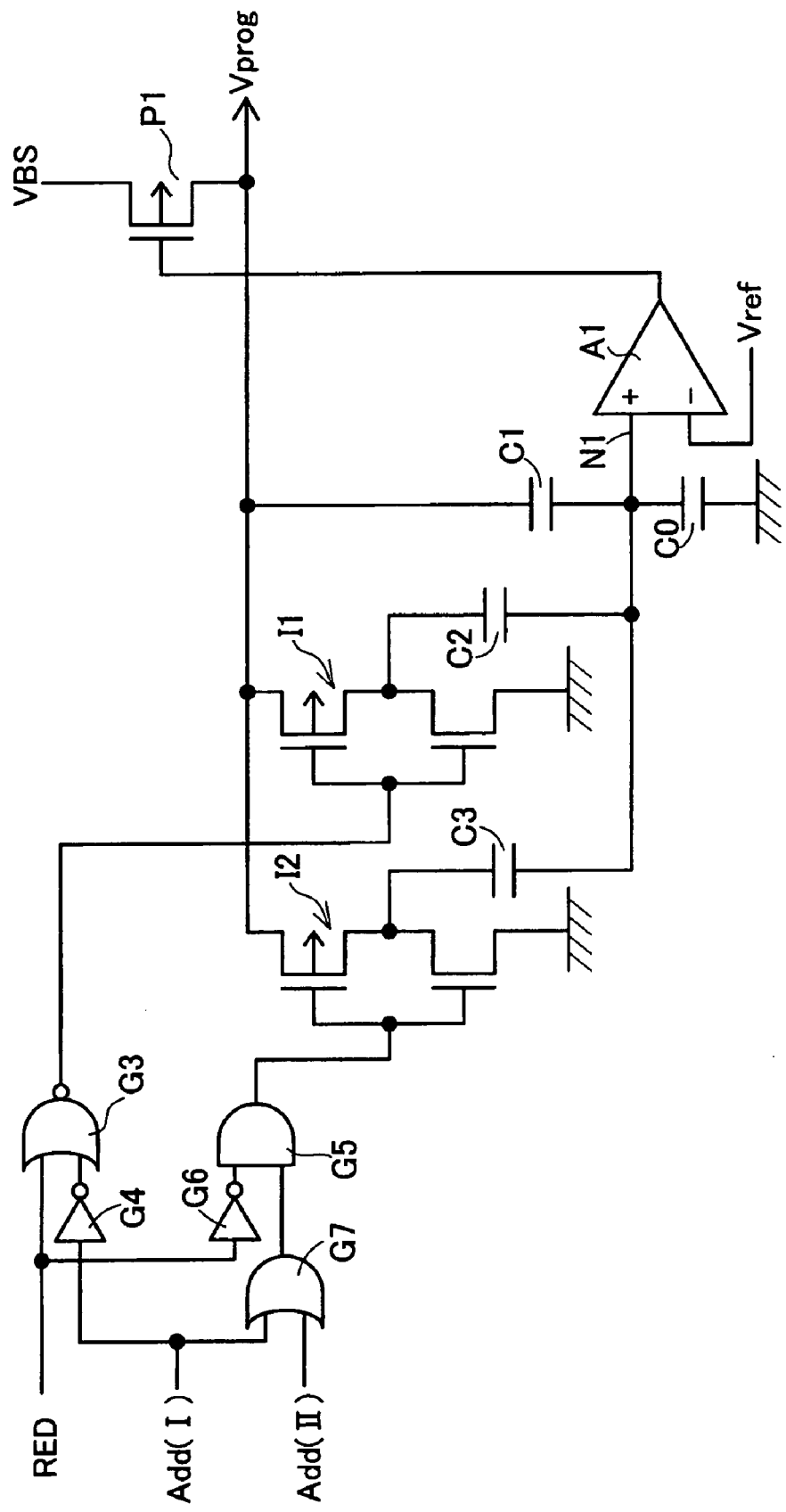
FIG. 13 is a diagram showing a bias voltage supply section in accordance with the fifth redundant memory block arrangement.

The exemplary bias voltage adjusting circuit shown in FIG. 13 has a NOR circuit G3 and an AND circuit G5 instead of the OR circuits G1 and G2 in the circuit shown in FIG. 10. The redundancy signal RED and a signal in which the address signal Add(I) is inputted to logic inverter circuit G4 to be logically inverted are inputted to the NOR circuit G3. A signal in which the redundancy signal RED is inputted to logic inverter circuit G6 to be logically inverted and the output signal of OR circuit G7 to which the address signals Add(I) and Add(II) are inputted are inputted to the AND circuit G5.

In accordance with the redundancy signal RED and the address signals Add(I) and Add(II), the other terminal of the capacitance device C2 and the other terminal of the capacitance device C3 are connected to any one of the bias voltage Vprog and the ground voltage to be constituted as the capacitance device CU or CL. As in the fourth redundant memory block arrangement of FIG. 10, the voltage value of the bias voltage Vprog in the fifth redundant memory block arrangement of FIG. 12 can be variably adjusted.

In FIG. 13, the output signals of the NOR circuit G3 and the AND circuit G5 are both at low level if redundancy processing is conducted (RED=Hi). In the inverter circuits I1 and I2, the PMOS transistors are conducted to connect the other terminal of the capacitance device C2 and the other terminal of the capacitance device C3 to the bias voltage Vprog. The capacitance devices C2 and C3 are added to the capacitance device C1 so that the capacitance device CL=C0 and the capacitance device CU=C1+C2+C3. The bias voltage Vprog is shown by the equation (3). In accordance with activation (high level) of the redundancy signal RED, the lowest voltage value shown by the equation (3) can be supplied as the bias voltage Vprog irrespective of an address signal. The voltage value of the bias voltage Vprog if block redundancy is conducted can be applied as suitable bias voltage to a redundant memory block.

Figure 14:
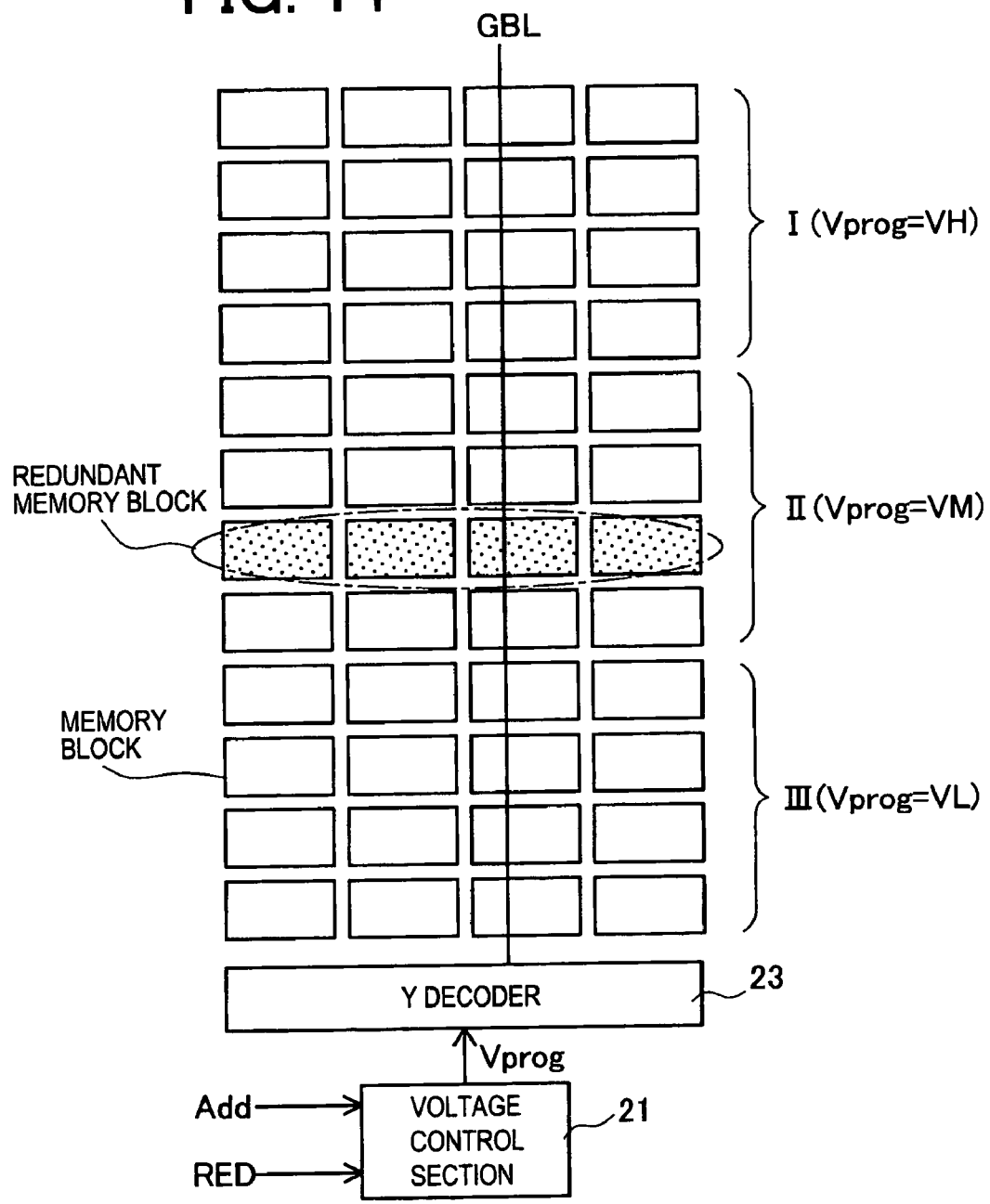
FIG. 14 is a layout schematic diagram illustrating a sixth redundant memory block arrangement when conducting bias voltage supply according to the second embodiment.

In a sixth redundant memory block arrangement shown in FIG. 14, the redundant memory blocks are arranged in the middle positions as compared with the arrangement positions of the redundant memory blocks from the voltage control section 21 in the fourth redundant memory block arrangement (FIG. 9) and the fifth redundant memory block arrangement (FIG. 12). The redundant memory blocks belong to the group of the memory block belonging to the middle distance from the voltage control section 21 (group II).

Figure 15:
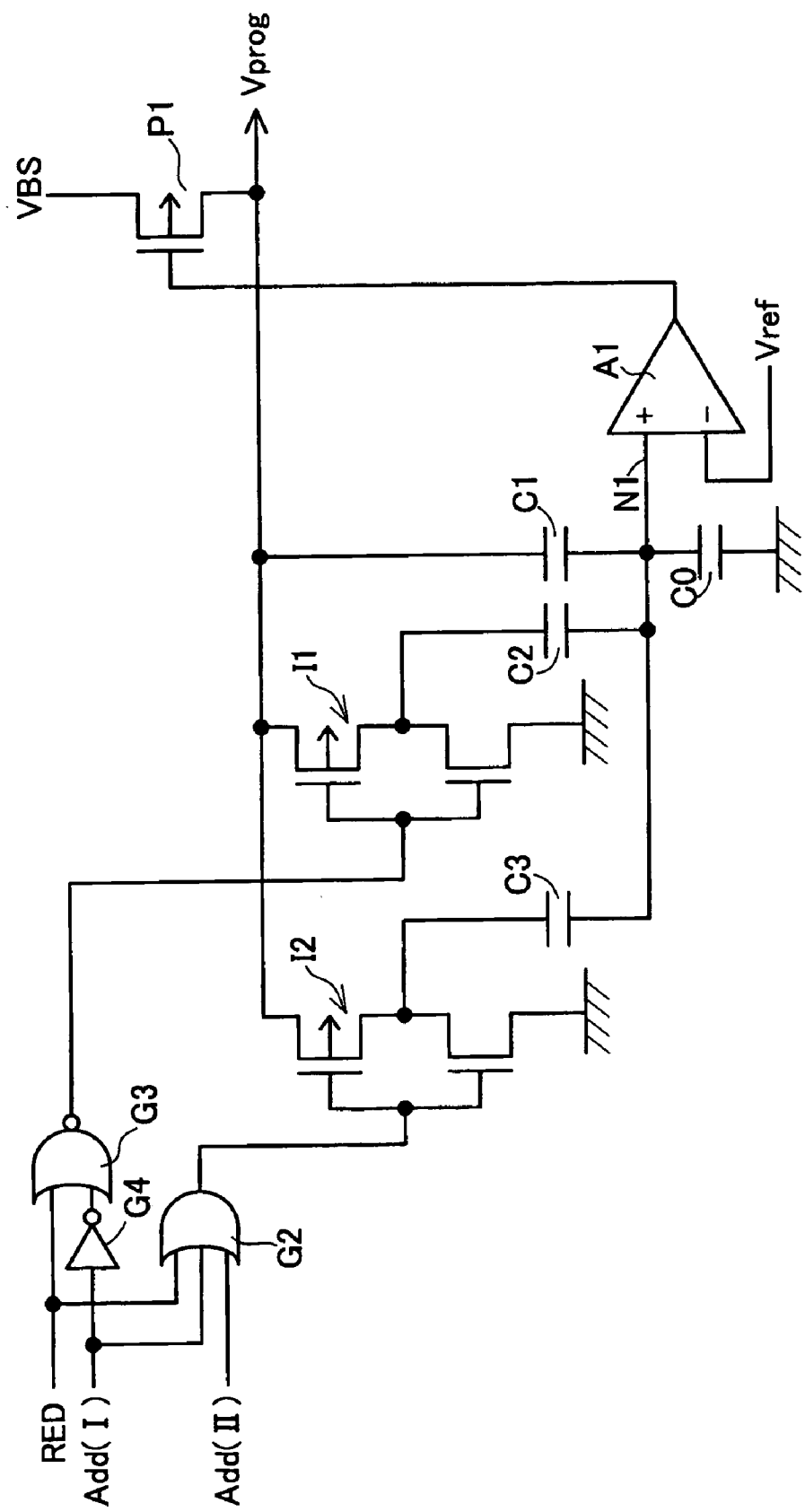
FIG. 15 is a diagram showing a bias voltage supply section in accordance with the sixth redundant memory block arrangement.

A bias voltage adjusting circuit example shown in FIG. 15 has the NOR circuit G3 instead of the OR circuit G1 in the circuit shown in FIG. 10. The address signal Add(I) is inputted to the logic inverter circuit G4 to be logically inverted and is then inputted to the NOR circuit G3. In accordance with the redundancy signal RED and the address signals Add(I) and Add(II), the other terminal of the capacitance device C2 and the other terminal of the capacitance device C3 are connected to any one of the bias voltage Vprog and the ground voltage to be constituted as the capacitance device CU or CL. In the sixth redundant memory block arrangement of FIG. 14, the voltage value of the bias voltage Vprog can be variably adjusted as in the fourth and fifth redundant memory block arrangements of FIGS. 10 and 13, respectively.

In FIG. 15, the output signal of the NOR circuit G3 is at a low level and the output signal of the AND circuit G2 is at a high level if redundancy is conducted (RED=Hi). In the inverter circuits I1 and I2, the PMOS/NMOS transistors are conducted to connect the other terminal of the capacitance device C2 and the capacitance device C3 to the bias voltage Vprog and the ground voltage, respectively. The capacitance device C2 is added to the capacitance device C1 and the capacitance device C3 is added to the capacitance device C0 so that the capacitance device CL=C0+C3 and the capacitance device CU=C1+C2. The bias voltage Vprog is shown by the equation (2). In accordance with activation (high level) of the redundancy signal RED, the voltage value at the middle voltage level shown by the equation (2) can be supplied as the bias voltage Vprog irrespective of an address signal. The voltage value of the bias voltage Vprog if block redundancy is conducted can be applied as sufficient bias voltage to redundant memory blocks.

Figure 16:
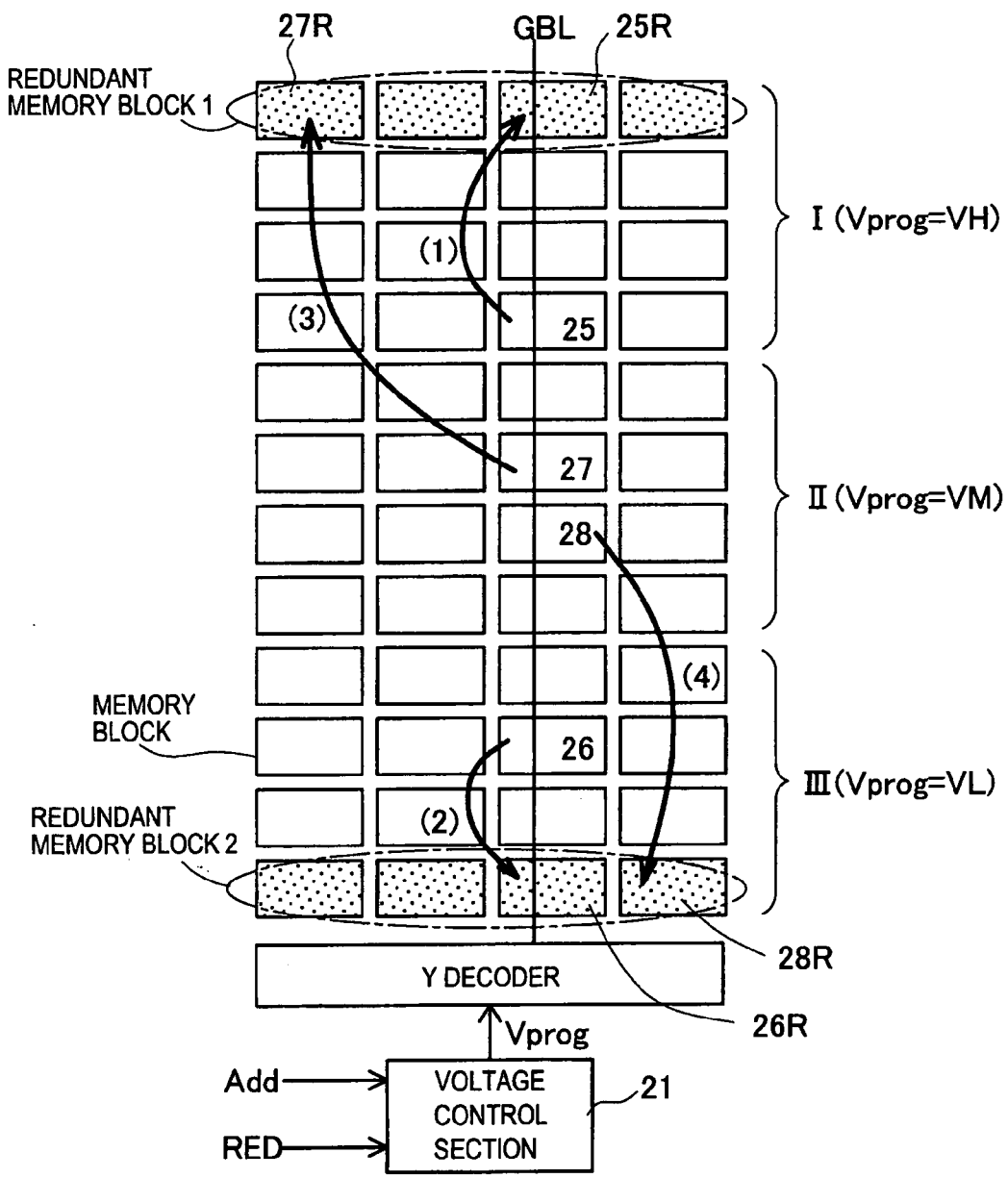
FIG. 16 is a layout schematic diagram illustrating a seventh redundant memory block arrangement when conducting bias voltage supply according to the second embodiment.
Figure 17:
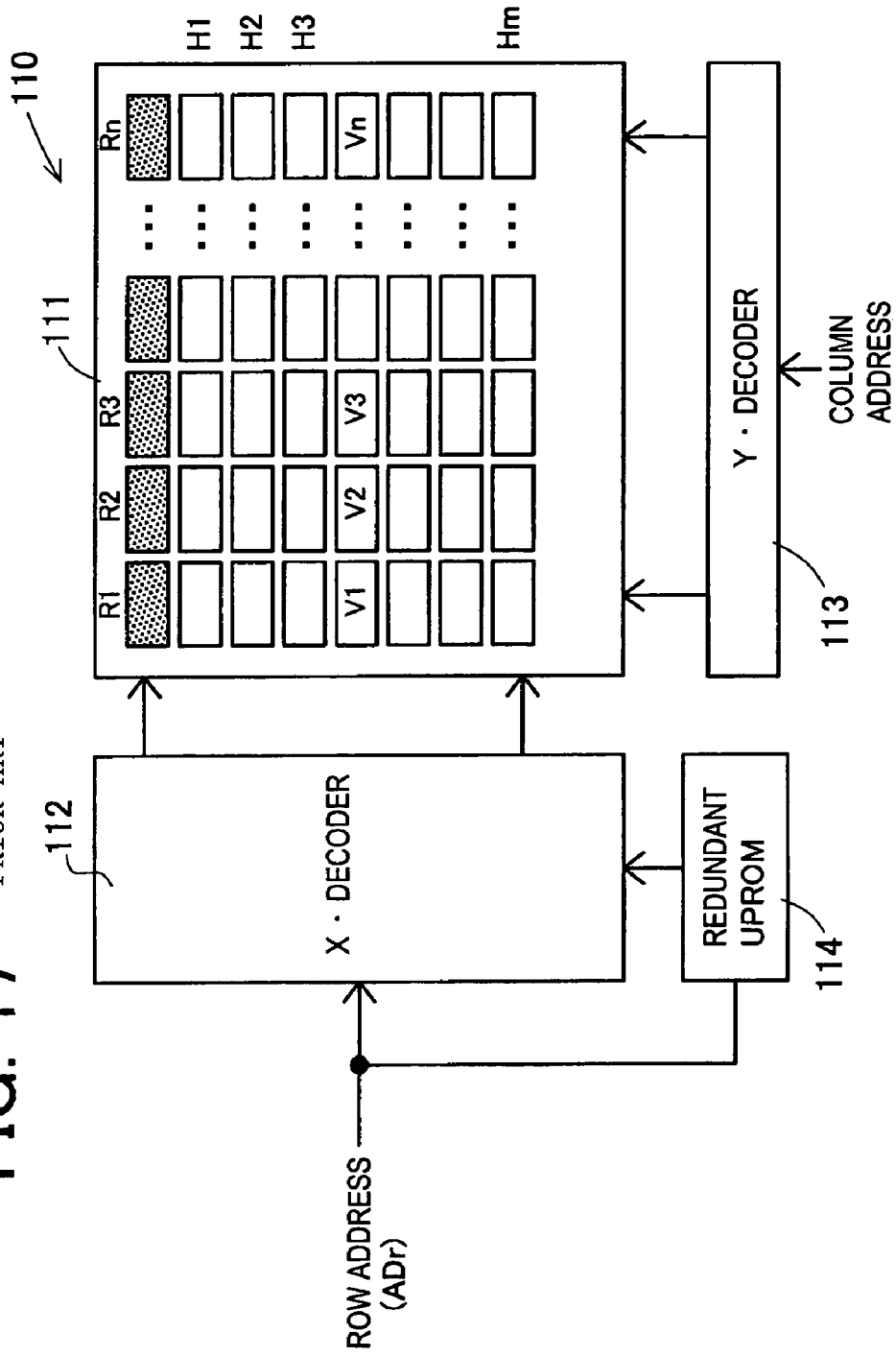
FIG. 17 is a conceptual diagram showing a redundancy sector constitution of Patent Document 1.
Figure 19:
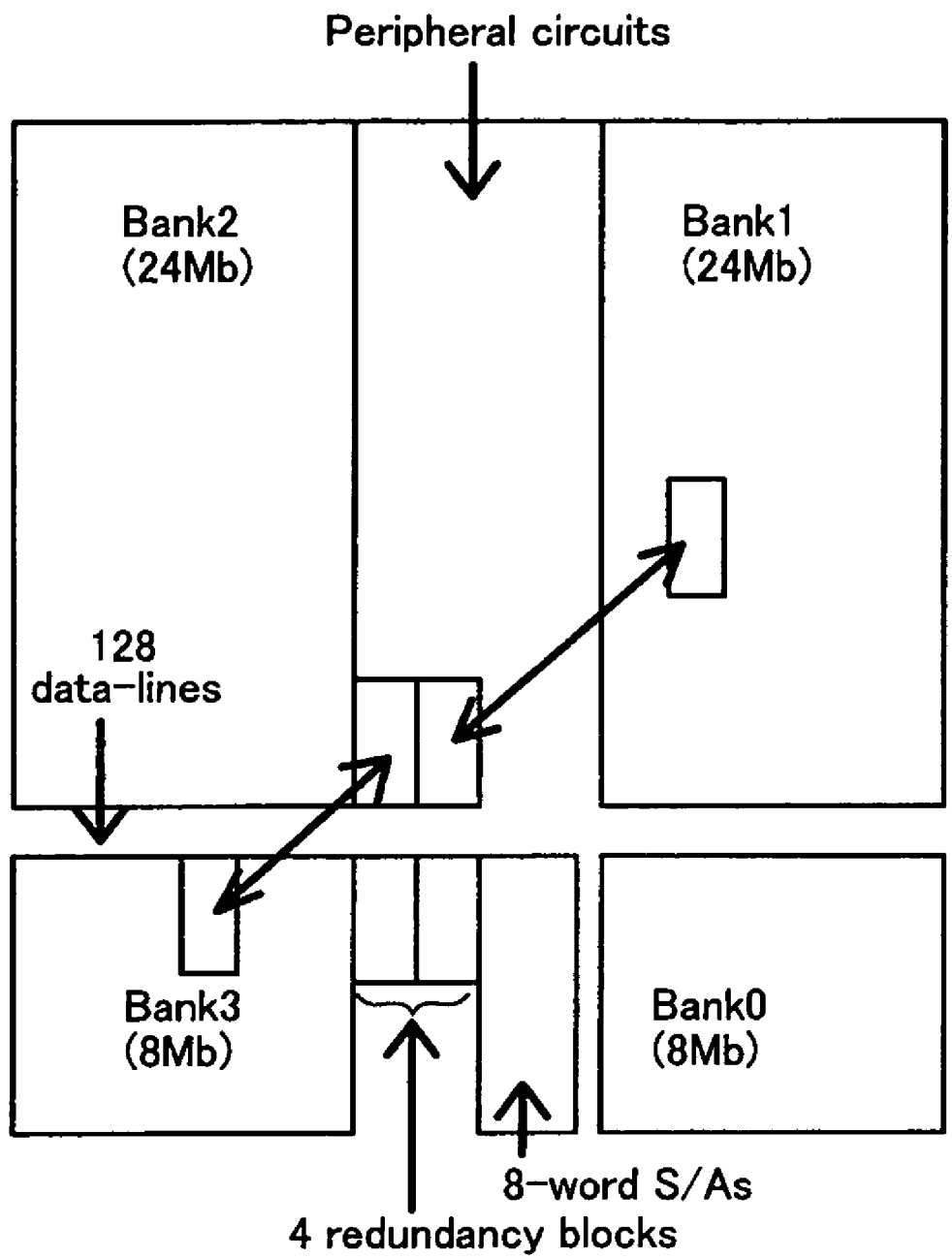
FIG. 19 is a conceptual diagram showing a redundancy sector constitution of Non-Patent Document.

A seventh redundant memory block arrangement shown in FIG. 16 has the combination of the fourth redundant memory block arrangement (FIG. 9) and the fifth redundant memory block arrangement (FIG. 12). Redundant memory blocks are arranged in the farthest point and the nearest point from the voltage control section 21 and belong to the groups I and III as the arrangement groups of memory blocks.

FIG. 16 depicts the case where a plurality of memory blocks belonging to one memory block column are redundancy remedied. A memory block 25 is redundancy remedied to be subject to block redundancy to redundant memory block 25R in the group I belonging to the same memory block column ((1) in the drawing). A memory block 26 is redundancy remedied to be subject to block redundancy to redundant memory block 26R in the group III belonging to the same memory block column ((2) in the drawing). A memory block 27 is redundancy remedied to be subject to block redundancy to redundant memory block 27R in the group I belonging to a different memory block column ((3) in the drawing). A memory block 28 is redundancy remedied to be subject to block redundancy to redundant memory block 28R in the group III belonging to a different memory block column ((3) in the drawing).

In this case, in block redundancy to the individual memory blocks 25 to 28, each of the redundancy remedied memory blocks 25 to 28 has redundancy signal RED (N) (N=1 to 4). With address signals identifying the memory blocks 25 to 28, the arrangement positions of the redundant memory blocks 25R to 28R on the redundancy remedied side will be identified as needed. The voltage control section 21 identifies the redundant memory blocks 25R to 28R on the redundancy remedied side in accordance with the redundancy signal RED (N) and the address signals to output the bias voltage Vprog depending on a length of the bit line reaching the positions in which the redundant memory blocks R25 to R28 are arranged.

As described above in detail, according to the first embodiment of the present invention, when redundancy remedy is conducted in the semiconductor memory device, the defectiveness in a redundant memory block can be redundancy remedied by column redundancy with block redundancy. A memory block column in which a redundant memory block is arranged is selected in accordance with the memory block column select signal Sm (m=0 to 3) as an example of the column designate signal to conduct column redundancy control. In replacement with a redundant memory block arranged in a memory block column different from a defective memory block, column redundancy can be conducted to the defectiveness in the redundant memory block. Column redundancy in a redundant memory block is conducted in addition to block redundancy to improve defectiveness remedy efficiency.

If block redundancy is not conducted by the memory block column select section 15 as an example of the block column designate section, the column redundancy memory section 17 and the column redundancy judge section 19 conduct column redundancy as needed to a memory block column in accordance with the inputted address information AddB. If block redundancy is conducted, the column redundancy memory section 17 and the column redundancy judge section 19 conduct column redundancy as needed to a memory block column including a redundant memory block irrespective of the address information AddB.

A procedure match-comparing the inputted address AddS and address information stored in a to-be-remedied block memory section 11 in the block redundancy judge section 13 is an example of a block redundancy judge step. A procedure match-comparing the inputted address Add and address information stored in the column redundancy memory section 17 in the column redundancy judge section 19 is a column redundancy judge step. A procedure selecting a memory block column in which a selected memory block or a redundant memory block is arranged in the memory block column select section 15 is a column redundancy control step.

Four memory block columns (m=0 to 3) adjoining each other sectioned by the banks A to D are a to-be-remedied unit. The number of redundant memory blocks is smaller than that of memory block column(s) included in each to-be-remedied unit. When the yield is enhanced through improvement in the manufacturing process and circuit constitution, redundant memory blocks necessary for defectiveness remedy can be provided. Column redundancy can be conducted to the defectiveness in a redundant memory block. Redundancy remedy efficiency can be improved while minimizing increased chip die size of the semiconductor memory device.

As shown in the first redundant memory block arrangement (FIG. 2) or the third redundant memory block arrangement (FIG. 8), when a redundant memory block is localized in a specific memory block column, a bit line used in the memory block column can be shared. An exclusive bit line need not be laid for the redundant memory block. Column redundancy control of the redundant memory block can be conducted in common with column redundancy control to a memory block belonging to a memory block column in which a redundant memory block is arranged.

In the third redundant memory block arrangement (FIG. 8), a redundant memory block is arranged on a region free from memory block(s). An open region left in accordance with the memory block arrangement specifications can be effectively used. The occupied area on a chip die due to the redundant memory block arrangement is not increased. A bit line and a word line can be shared with a peripheral memory block. No exclusive wiring and control circuits are necessary. An exclusive arrangement region for a redundant memory block need not be secured.

As shown in the second redundant memory block arrangement (FIG. 5), redundant memory blocks divided into redundancy memory sub-blocks by a memory block column are not arranged in a specific memory block column. An inefficient layout such as wiring bypass with the protrusive arrangement can be avoided. It is possible to realize a layout which can reduce the unevenness at the peripheral edge of a storage area in which memory blocks are developed and which has good wiring efficiency.

According to the second embodiment of the present invention, as the length of the global bit line GBL from the voltage control section 21 as an example of the bias voltage supply section to a memory block or a redundant memory block is longer, the higher bias voltage Vprog is supplied. Thus, the influence of a voltage drop due to the wiring resistance of the global bit line GBL can be reduced. The memory cells in a memory block or the redundant memory cells in a redundant memory block can be biased by a predetermined voltage value irrespective of the distance from the voltage control section 21.

As shown in the seventh redundant memory block arrangement (FIG. 16), when a plurality of redundant memory blocks in which different distances from the voltage control section 21 are provided, the voltage value of the bias voltage Vprog is supplied in accordance with different redundancy signals RED (N) by redundant memory blocks. Predetermined bias voltages can be supplied to the redundant memory cells of the redundant memory blocks.

In the circuit design examples of the voltage control section 21 shown in FIGS. 10, 13 and 15, the capacitance devices C0 to C3, the inverter circuits I1 and I2, and the control circuits G1 to G7 are examples of the voltage set section. The amplifier A1 and the PMOS transistor P1 are examples of the voltage adjust section. As shown in FIG. 11, the voltage set section divides the bias voltage Vprog depending on capacity ratio of the capacitance devices connected in series. No electric current flows steadily in the voltage division.

The voltage control section 21 shown in FIGS. 10, 13 and 15 has a first voltage adjust step for adjusting the voltage value of the bias voltage Vprog in accordance with the address signals Add(I) and Add(II) if redundancy processing is not conducted and a second voltage adjust step for adjusting the voltage value of the bias voltage Vprog in accordance with activation of the redundancy signal RED irrespective of the address signals Add(I) and Add(II) if redundancy processing is conducted.

The present invention is not limited to the embodiments and various improvements and modifications can be made in the scope without departing from the purpose of the present invention.

For example, in the first embodiment, for the first to third redundant memory block arrangements, the redundancy judge procedure when conducting block redundancy and column redundancy in redundant memory block is described. The present invention is not limited to this. In the redundancy construction of an arbitrary combination of the first and third redundant memory block arrangements, the bit line of a redundant memory block is shared with the bit line of a memory block column. Column redundancy can be conducted in accordance with a memory block column select signal by selecting a memory block column in which a redundant memory block to be subject to block redundancy is arranged.

In the second embodiment, an example is described in which the 4 redundant memory block arrangement positions are the same between memory block columns. The present invention is also not limited to this. When a redundant memory block arrangement position can be specified by the redundancy signal RED (N) (N=1 to 4) selecting the redundancy remedied side and the address signal identifying memory block as needed, the bias voltage Vprog having a suitable voltage value can be supplied by the redundant memory block.

A semiconductor memory device which discloses the first concept of the present invention made to overcome the deficiencies of the prior art is characterized by bit lines; word lines wired orthogonally on the bit lines; and memory cells connected to the bit lines and the word lines, the memory cells being arranged in a matrix to form a memory block, a plurality of which are arranged in a bit line wiring direction sharing respective bit lines to form a memory block column arranged in word line wiring direction, at least one memory block column including a redundancy memory block arranged sharing bit lines with a memory block for remedying a defective memory block, a block redundancy judge section for selecting a redundancy memory block from at least redundancy memory block(s) by outputting a redundancy block select signal in case a memory block including inputted address information is a defective memory block; a block column designate section for designating a memory block column inclusive of a selected redundancy memory block by outputting a column designate signal depending on the redundancy block select signal; and a column redundancy control section for conducting column redundant control by memory block column including a redundant memory block, wherein column redundant control of a selected redundant memory block is conducted by the column redundant control section depending on the column designate signal.

In the above semiconductor memory device, when replacing a memory block including inputted address information, the block redundancy judge section selects at least one of redundant memory blocks to output the redundancy block select signal. The block column designate section which has received the redundant block select signal outputs the column designate signal designating a memory block column inclusive of the redundant memory block. Column redundancy control of the redundant memory block is conducted by the column redundancy control section depending on the column designate signal.

If redundancy remedy is conducted in the semiconductor memory device, a defective memory block can be replaced with a redundant memory block by block redundancy and the defectiveness in the redundant memory block can be redundancy remedied by column redundancy. At this time, column redundancy control is conducted depending on the column designate signal to a memory block column in which a redundant memory block is arranged. If redundancy processing is conducted to a redundant memory block arranged in a memory block column different from the defective memory block, column redundancy can be performed to the defectiveness in the redundant memory block. Column redundancy in the redundant memory block is conducted in addition to block redundancy to improve defectiveness remedy efficiency.

The block column designate section is characterized in that it designates a memory block column in accordance with inputted address information in case the redundant block select signal is not inputted, and designates a memory block column in accordance with the redundant block select signal irrespective of inputted address information if the redundant block select signal is inputted. If block redundancy is not conducted, column redundancy is conducted in a memory block column in accordance with inputted address information. If block redundancy is conducted, column redundancy control of a memory block column in which a redundant memory block is arranged is conducted irrespective of address information to conduct column redundancy of the redundant memory block.

The column redundancy control section is characterized in that it includes a to-be-remedied information memory section in which to-be-remedied column address information relating a memory block or/and a redundant memory block included in a memory block column is stored. To-be-remedied address information relating a memory block by memory block column is stored. To-be-remedied address information relating a memory block and a redundant memory block in a memory block column having a redundant memory block is stored.

The semiconductor memory device is characterized in that at least two of memory block columns adjoining each other constitute a to-be-remedied unit and, in each to-be-remedied unit, number of redundant memory block(s) is smaller than that of memory block column(s) belonging to the to-be-remedied unit.

The redundant memory blocks for applying block redundancy remedies number of defective memory block which is smaller than that of memory block column constituting the to-be-remedied unit.

The yield is enhanced with optimization of the manufacturing and circuits through improvement in the manufacturing process and circuit constitution. At this point, redundant memory blocks necessary for defectiveness remedy of the semiconductor memory device can be provided. Column redundancy can be conducted to the defectiveness in a redundant memory block. Redundancy remedy efficiency can be improved while minimizing increased chip die size of the semiconductor memory device.

A redundant memory block does not exist by memory block column and is localized in a predetermined memory block column. A bit line used in the memory block column is shared. An exclusive bit line for the redundant memory block need not be laid. Column redundancy control of the redundant memory block can be conducted in common with column redundancy control to a memory block belonging to a memory block column in which a redundant memory block is arranged.

In addition, a semiconductor memory device is characterized in that redundant memory block(s) is/are arranged with block(s) divided into redundant memory sub-blocks by the memory block column belonging to the to-be-remedied unit, and each to-be-remedied memory sub-block has memory capacity equivalent to memory capacity of the memory block divided by a factor (1 is excluded) for factorization of the number of memory block columns belonging to the to-be-remedied unit.

Redundant memory blocks are distributively arranged in respective memory block columns. The redundant memory blocks are not protrusibly arranged in a specific memory block column. An inefficient layout such as wiring bypass with the protrusible arrangement can be avoided. The unevenness at the peripheral edge of a storage area in which memory blocks are developed is reduced to realize a layout having good wiring efficiency.

Redundant memory block(s) may be arranged on region (s) free from memory block(s) existing in the to-be-remedied unit. The region free from memory block is open region of memory block left on the original arrangement position when access information to a predetermined memory block is replaced so as to indicate a specific memory block arranged in a specific arrangement position instead of the original arrangement position. The open region left in accordance with the memory block arrangement specifications in the semiconductor memory device can be effectively used. The open region(s) exists/exist in one corner of memory block column. Bit lines and word lines can be both shared with peripheral memory blocks. No exclusive wiring and control circuits are necessary. No exclusive arrangement regions need be secured for redundant memory blocks. The occupied area on a chip die due to the redundant memory block arrangement is not increased.

Suppose memory cells are non-volatile memory cells, the semiconductor memory device described above is a non-volatile semiconductor memory device, and the memory block and the redundant memory block are a unit of batch erase.

Further, the semiconductor memory device which discloses another concept of the present invention made to achieve the above object is characterized in a plurality of bit lines each of which is connected to a plurality of memory cells, at least one of bit lines is connected to at least one redundant memory cell(s); and a bias voltage supply section for supplying high bias voltage to memory cells or/and redundant memory cells through bit line depending on length of the bit line, wherein, in case redundancy processing is not conducted, the bias voltage supply section supplies a bias voltage value based on address information which indicates a connection point of bit line and memory cell and in case redundancy processing is conducted, defruiting of the address information is executed in accordance with a redundancy select signal and the bias voltage supply section supplies a bias voltage value based on length of bit line reaching redundant memory cell.

When biasing voltage to memory cells and/or redundant memory cells through a bit line by bias voltage supply, voltage depending on length of the bit line reaching a memory cell based on address information which indicates a bit line connection position is supplied to the memory cell accessed if redundancy processing is not conducted. Voltage based on length of bit line reaching to a redundant memory cell in accordance with a redundancy select signal is supplied to the redundant memory cell accessed if redundancy processing is conducted. At this time, as length of bit line from the bias voltage supply section to a memory cell or a redundant memory cell is longer, higher bias voltage is supplied.

When supplying bias voltage from the bias voltage supply section to memory cells or/and redundant memory cells through a bit line, the influence of a voltage drop due to the wiring resistance of the bit line can be reduced. Memory cells or/and redundant memory cells can be biased by a predetermined voltage value irrespective of the distance of a length of the bit line from the bias voltage supply section.

In case length of bit lines from the bias voltage supply section to a plurality of redundant memory cells differs, the bias voltage supply section supplies a bias voltage value in accordance with a redundancy select signal which differs by respective redundant memory cells. Predetermined bias voltage can be supplied to respective redundant memory cells.

Preferably, the bias voltage supply section includes: a voltage set section for setting voltage division ratio of bias voltage in accordance with the address information or/and the redundancy select signal; and a voltage adjust section for adjusting a target bias voltage value by adjusting divided voltage set by the voltage set section to reference voltage. The voltage division ratio is adjusted in accordance with the address information or/and the redundancy select signal to obtain a target bias voltage value.

Preferably, the voltage set section sets voltage division ratio depending on capacity ratio of capacitance devices connected in series. Voltage can be divided without steady electric current consumption.

Furthermore, if memory cells are unified as memory block by predetermined number of bit lines and predetermined length of bit line, redundant memory cells are included in redundant memory block for block redundancy, the address information is for identifying memory block in bit line length direction, and the redundancy select signal is for identifying redundant memory block to be selected for block redundancy, the bias voltage may be controlled in units of memory block and redundant memory block.

Suppose a semiconductor memory device memory cells are non-volatile memory cells, the above semiconductor memory device is a non-volatile semiconductor memory device, and bias voltage supplied by the bias voltage supply section is voltage to be applied when memory information is written or erased.

Further, redundancy control method for a semiconductor memory device which discloses the first concept of the present invention made to achieve the above object is characterized in bit lines; word lines wired orthogonally on the bit lines; and memory cells connected to the bit lines and the word lines, the memory cells being arranged in matrix to form a memory block, a plurality of memory blocks being arranged in bit line wiring direction sharing respective bit lines to form memory block column arranged in word line wiring direction, the redundancy control method comprising the steps of: block redundancy judge step for judging whether or not to apply block redundancy to redundant memory block(s) which is/are arranged sharing bit lines with at least one memory block column(s) with respect to inputted address information; column redundancy judge step for judging whether or not apply block redundancy by memory block column; and column redundancy control step where in case the block redundancy judge step judges not to apply block redundancy, column redundancy information of memory block column corresponding to the address information is supplied to the column redundancy judge step, and in case the block redundancy judge step judges to apply block redundancy, column redundancy information of a memory block column in which a redundancy memory block is arranged is supplied to the column redundancy judge step.

In the redundancy control method for the semiconductor memory device, the block redundancy judge step judges whether or not to apply block redundancy to redundant memory block with respect to inputted address information. The column redundancy judge step judges whether or not to apply column redundancy by memory block column. The column redundancy control step if the block redundancy judge step judges not to apply block redundancy, column redundancy information of memory block column corresponding to the address information is supplied to the column redundancy judge step, and if the block redundancy judge step judges to apply block redundancy, column redundancy information of a memory block column in which a redundant memory block is arranged is supplied to the column redundancy judge step. In the redundant memory block, a bit line is shared with at least one memory block column.

If redundancy remedy is conducted in the semiconductor memory device, a defective memory block can be replaced with a redundant memory block by block redundancy and the defectiveness in the redundant memory block can be redundancy remedied by column redundancy. At this time, column redundancy control is conducted to a memory block column in which a redundant memory block is arranged. If redundancy processing is conducted to a redundant memory block arranged in a memory block column different from the defective memory block, column redundancy can be performed to the defectiveness in the redundant memory block. Column redundancy in the redundant memory block is conducted in addition to block redundancy to improve defectiveness remedy efficiency.

Redundancy control method for a semiconductor memory device which discloses another concept of the present invention made to achieve the above object is characterized in a plurality of bit lines each of which is connected to a plurality of memory cells, at least one of bit lines is connected to at least one redundant memory cell(s), for supplying bias voltage to memory cells or/and redundant memory cells through bit line, the redundancy control method comprising the steps of: first voltage adjust step for adjusting bias voltage to high level in accordance with address information corresponding to length of bit line reaching memory cell, namely, a connection point of bit line and memory cell, in case redundancy processing is not conducted; and second voltage adjust step for adjusting bias voltage to high level in accordance with a redundancy select signal corresponding to length of bit line reaching memory cell instead of the address information in case redundancy processing is conducted.

When supplying bias voltage to memory cells or/and redundant memory cells through bit line, first voltage adjust step determines a bias voltage value in accordance with address information corresponding to length of bit line reaching memory cell, namely, a bit line connection position to the memory cell accessed if redundancy processing is not conducted, and second voltage adjust step determines bias voltage in accordance with a redundancy select signal corresponding to length of bit line reaching redundant memory cell to the redundant memory cell accessed if redundancy processing is conducted. As the length of bit line supplied through the bit line is longer, a higher bias voltage is supplied.

When supplying bias voltage from a bias voltage supply source through bit line to memory cell or/and redundant memory cell, the influence of a voltage drop due to the wiring resistance of the bit line can be reduced and the memory cell or/and the redundant memory cell can be biased by a predetermined voltage value irrespective of the distance of length of bit line.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

INDUSTRIAL APPLICABILITY

As is apparent from the above description, according to the present invention it is possible to provide a semiconductor memory device and a redundancy control method for the semiconductor memory device which can conduct column redundancy in a redundant memory block on the block redundancy in addition to block redundancy, can improve redundancy remedy efficiency while reducing increased chip die area, and can supply suitable voltage bias irrespective of the arrangement position of a redundant memory block by adjusting the voltage value in accordance with the length of bit line when supplying bias voltage to the redundant memory block through the bit line.

What is claimed is:

1. A semiconductor memory device comprising:
bit lines;
word lines wired orthogonally on the bit lines;
memory cells connected to the bit lines and the word lines, the memory cells being arranged in a matrix to form a memory block, a plurality of which are arranged in a bit line wiring direction sharing respective bit lines to form memory block columns arranged in word line wiring direction, at least one memory block column including a redundancy memory block arranged sharing bit lines with a memory block for remedying a defective memory block;
a block redundancy judge section for selecting a redundancy memory block from at least redundancy memory block(s) by outputting a redundancy block select signal in case a memory block including inputted address information is a defective memory block;
a block column designate section for designating a memory block column inclusive of a selected redundancy memory block by outputting a column designate signal depending on the redundancy block select signal; and
a column redundancy control section for conducting column redundant control by memory block column including a redundant memory block,
wherein column redundant control of a selected redundant memory block is conducted by the column redundant control section depending on the column designate signal.

2. A semiconductor memory device according to claim 1, wherein the block column designate section designates a memory block column in accordance with inputted address information in case the redundant block select signal is not inputted, and designates a memory block column in accordance with the redundant block select signal irrespective of inputted address information in case the redundant block select signal is inputted.

3. A semiconductor memory device according to claim 1, wherein the column redundancy control section includes a to-be-remedied information memory section in which to-be-remedied column address information relating a memory block or/and a redundancy memory block included in a memory block column is stored.

4. A semiconductor memory device according to claim 1, wherein at least two of memory block columns adjoining each other constitute a to-be-remedied unit and, in each of the to-be-remedied unit, number of redundant memory block(s) is smaller than that of memory block column(s) belonging to the to-be-remedied unit.

5. A semiconductor memory device according to claim 4, wherein
redundant memory block(s) is/are arranged with block(s) divided into redundant memory sub-blocks by the memory block column belonging to the to-be-remedied unit, and
each to-be-remedied memory sub-block has memory capacity equivalent to memory capacity of the memory block divided by a factor (1 is excluded) for factorization of the number of memory block columns belonging to the to-be-remedied unit.

6. A semiconductor memory device according to claim 4, wherein redundant memory block(s) is/are arranged on region(s) free from memory block(s) existing in the to-be-remedied unit.

7. A semiconductor memory device according to claim 1, wherein memory cells are non-volatile memory cells, and the memory block and the redundant memory block are a unit of batch erase.

8. A semiconductor memory device comprising:
a plurality of bit lines each of which is connected to a plurality of memory cells, at least one of bit lines is connected to at least one redundant memory cell(s); and
a bias voltage supply section for supplying high bias voltage to memory cells or/and redundant memory cells through bit line depending on length of the bit line, wherein, in the case where redundancy processing is not conducted, the bias voltage supply section supplies a bias voltage value based on address information which indicates a connection point of bit line and memory cell and in the case where redundancy processing is conducted, defruiting of the address information is executed in accordance with a redundancy select signal and the bias voltage supply section supplies a bias voltage value based on length of bit line reaching redundant memory cell.

9. A semiconductor memory device according to claim 8, wherein, in the case where the length of bit lines from the bias voltage supply section to a plurality of redundant memory cells differs, the bias voltage supply section supplies a bias voltage value in accordance with a redundancy select signal which differs by respective redundant memory cells.

10. A semiconductor memory device according to claim 8, wherein the bias voltage supply section includes:
a voltage set section for setting voltage division ratio of bias voltage in accordance with the address information or/and the redundancy select signal; and
a voltage adjust section for adjusting a target bias voltage value by adjusting divided voltage set by the voltage set section to reference voltage.

11. A semiconductor memory device according to claim 10 wherein the voltage set section sets voltage division ratio depending on capacity ratio of capacitance devices connected in series.

12. A semiconductor memory device according to claim 8 wherein memory cells are unified as memory block by predetermined number of bit lines and predetermined length of bit line,
redundant memory cells are included in redundant memory block for block redundancy,
the address information is for identifying memory block in bit line length direction, and
the redundancy select signal is for identifying redundant memory block to be selected for block redundancy.

13. A semiconductor memory device according to claim 8, wherein memory cells and redundant memory cells are non-volatile memory cells, and bias voltage supplied by the bias voltage supply section is voltage to be applied when memory information is written or erased.

14. A redundancy control method in a semiconductor memory device comprising bit lines; word lines wired orthogonally on the bit lines; and memory cells connected to the bit lines and the word lines, the memory cells being arranged in matrix to form a memory block, a plurality of memory blocks being arranged in bit line wiring direction sharing respective bit lines to form memory block column arranged in word line wiring direction, the redundancy control method comprising the steps of:
a block redundancy judge step for judging whether or not to apply block redundancy to redundant memory block (s) which is/are arranged sharing bit lines with at least one memory block column(s) with respect to inputted address information;
a column redundancy judge step for judging whether or not apply block redundancy by memory block column; and
a column redundancy control step where in case the block redundancy judge step judges not to apply block redundancy, column redundancy information of memory block column corresponding to the address information is supplied to the column redundancy judge step, and in the case where the block redundancy judge step judges to apply block redundancy, column redundancy information of a memory block column in which a redundancy memory block is arranged is supplied to the column redundancy judge step.

15. A redundancy control method for a semiconductor memory device comprising a plurality of bit lines each of which is connected to a plurality of memory cells, at least one of bit lines is connected to at least one redundant memory cell(s), for supplying bias voltage to memory cells or/and redundant memory cells through bit line, the redundancy control method comprising the steps of:
a first voltage adjust step for adjusting bias voltage to high level in accordance with address information corresponding to length of bit line reaching memory cell, namely, a connection point of bit line and memory cell, in case redundancy processing is not conducted; and
a second voltage adjust step for adjusting bias voltage to high level in accordance with a redundancy select signal corresponding to length of bit line reaching memory cell instead of the address information in case redundancy processing is conducted.

* * * * *